(12) United States Patent
Arthur et al.

(10) Patent No.: US 11,271,076 B2
(45) Date of Patent: Mar. 8, 2022

(54) SYSTEMS AND METHODS FOR JUNCTION TERMINATION IN SEMICONDUCTOR DEVICES

(71) Applicant: General Electric Company, Schenectady, NY (US)

(72) Inventors: Stephen Daley Arthur, Glenville, NY (US); Victor Mario Torres, Clifton Park, NY (US); Michael J. Hartig, Schenectady, NY (US); Reza Ghandi, Niskayuna, NY (US); David Alan Lilienfeld, Niskayuna, NY (US); Alexander Viktorovich Bolotnikov, Niskayuna, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 72 days.

(21) Appl. No.: 16/517,222

(22) Filed: Jul. 19, 2019

(65) Prior Publication Data
US 2020/0203476 A1  Jun. 25, 2020

Related U.S. Application Data

(60) Provisional application No. 62/783,683, filed on Dec. 21, 2018.

(51) Int. Cl.
*H01L 29/15* (2006.01)
*H01L 31/0312* (2006.01)
(Continued)

(52) U.S. Cl.
CPC ...... *H01L 29/0634* (2013.01); *H01L 21/0465* (2013.01); *H01L 29/0619* (2013.01);
(Continued)

(58) Field of Classification Search
CPC ............. H01L 29/0634; H01L 21/0465; H01L 29/66068; H01L 29/0619; H01L 29/0623;
(Continued)

(56) References Cited

U.S. PATENT DOCUMENTS

| | | | |
|---|---|---|---|
| 6,274,904 B1 * | 8/2001 | Tihanyi | H01L 29/0619 257/256 |
| 6,861,706 B2 * | 3/2005 | Tihanyi | H01L 29/0634 257/342 |

(Continued)

FOREIGN PATENT DOCUMENTS

WO    2017105414 A1    6/2017

OTHER PUBLICATIONS

Temple, Victor A. K.; "Junction Termination Extension for Near-Ideal Breakdown Voltage in p-n Junctions", Oct. 1986, pp. 1601-1608, vol. ED-33, No. 10.

(Continued)

*Primary Examiner* — Ismail A Muse
(74) *Attorney, Agent, or Firm* — Fletcher Yoder, P.C.

(57) ABSTRACT

The subject matter disclosed herein relates to semiconductor power devices and, more specifically, to junction termination designs for wide-bandgap (e.g., silicon carbide) semiconductor power devices. A disclosed semiconductor device includes a first epitaxial (epi) layer disposed on a substrate layer, wherein a termination area of the first epi layer has a minimized epi doping concentration of a first conductivity type (e.g., n-type). The device also includes a second epi layer disposed on the first epi layer, wherein a termination area of the second epi layer has the minimized epi doping concentration of the first conductivity type and includes a first plurality of floating regions of a second conductivity type (e.g., p-type) that form a first junction termination of the device.

20 Claims, 26 Drawing Sheets

(51) Int. Cl.
*H01L 29/06* (2006.01)
*H01L 29/16* (2006.01)
*H01L 21/04* (2006.01)
*H01L 29/66* (2006.01)

(52) U.S. Cl.
CPC ...... *H01L 29/0623* (2013.01); *H01L 29/1608* (2013.01); *H01L 29/66068* (2013.01)

(58) Field of Classification Search
CPC ............. H01L 29/1608; H01L 29/7811; H01L 29/0615
See application file for complete search history.

(56) References Cited

U.S. PATENT DOCUMENTS

| | | | |
|---|---|---|---|
| 7,955,929 B2* | 6/2011 | Stefanov | H01L 29/66719 438/268 |
| 8,343,834 B2* | 1/2013 | Willmeroth | H01L 29/0878 438/268 |
| 8,432,012 B2 | 4/2013 | Zhang et al. | |
| 9,461,108 B2 | 4/2016 | Konstantinov | |
| 9,490,359 B2* | 11/2016 | Nakajima | H01L 29/0882 |
| 2006/0255423 A1* | 11/2006 | Ryu | H01L 29/6606 257/485 |
| 2009/0090967 A1 | 4/2009 | Chen et al. | |
| 2010/0078775 A1* | 4/2010 | Mauder | H01L 29/1095 257/655 |
| 2014/0231969 A1* | 8/2014 | Mauder | H01L 29/36 257/655 |
| 2014/0346531 A1* | 11/2014 | Imai | H01L 21/28518 257/77 |
| 2015/0069567 A1* | 3/2015 | Yedinak | H01L 29/7813 257/493 |
| 2018/0076196 A1* | 3/2018 | Makita | H01L 27/0814 |

OTHER PUBLICATIONS

Kimoto, Tsunenobu, et al.; "Fundamentals of Silicon Carbide Technology: Growth, Characterization, Devices and Applications", Nov. 24, 2014, pp. 1-4, Wiley-IEEE Press.
Bolotnikov, Alexander; "SiC Charge-Balanced Devices Offering Breakthrough Performance Surpassing the 1-D Ron versus BV Limit", 2018, pp. 1-4.
Koo, Yoon-Mo, et al.; "The Analysis of the Breakdown Voltage According to the Change of JTE Structures and Design Parameters of 4H-SiC Device", j.inst.Korean.electr.electron.eng., Dec. 2015, vol. 19, No. 4, pp. 491-499.
International Search Report/Written Opinion; PCT/US2019/068123 dated Apr. 29, 2020, 11 pages.

* cited by examiner

SYSTEMS AND METHODS FOR JUNCTION TERMINATION IN SEMICONDUCTOR DEVICES

CROSS-REFERENCE TO RELATED APPLICATIONS

This application claims priority to U.S. Patent Provisional Application No. 62/783,683, entitled "SYSTEMS AND METHODS FOR JUNCTION TERMINATION IN SEMICONDUCTOR DEVICES", filed Dec. 21, 2018, which is herein incorporated by reference in its entirety for all purposes.

BACKGROUND

The subject matter disclosed herein relates to semiconductor power devices and, more specifically, to junction termination designs for wide-bandgap semiconductor power devices.

For a semiconductor power device, a termination, such as a junction termination, can be used to generally prevent electric field crowding near the edges of an active area of the device during reverse bias operation. As used herein, the term "junction termination" is meant to encompass termination structures that employ p/n junctions, either floating or electrically attached to the primary blocking junction, as a means for shaping and controlling the electric field surrounding the active area of a device. However, while terminations improve device reliability and operation, there is also a cost associated with using terminations. For instance, terminations generally occupy a certain amount of the die area of a semiconductor power device, referred to herein as a termination area. Along with other portions of the device (e.g., a gate bus region, a gate pad region, etc.), the termination area contributes to what is referred to herein as the overhead area of the device. As such, while the active area of the device includes device cells (e.g., metal-oxide-semiconductor field-effect transistors (MOSFET) cells) for power conversion, the overhead area includes features that support operation of these device cells.

Accordingly, it may be desirable to maximize a ratio of the active area to the overhead area of a device to enhance performance. A wide termination results in a large termination area and a large overhead area, and this limits the amount of die area available for the active area of the device. Accordingly, by reducing the overhead area, the ratio of the active area to overhead area may be increased, which can improve the efficiency and/or operation of the device.

BRIEF DESCRIPTION

In an embodiment, a semiconductor device includes a first epitaxial (epi) layer disposed on a substrate layer, wherein a termination area of the first epi layer has a minimized epi doping concentration of a first conductivity type. The device also includes a second epi layer disposed on the first epi layer, wherein a termination area of the second epi layer has the minimized epi doping concentration of the first conductivity type and a first plurality of floating regions of a second conductivity type that form a first junction termination of the device.

In an embodiment, a method of manufacturing a silicon carbide (SiC) device includes forming a buried epitaxial (epi) layer of the SiC device by: forming a first epi layer on an underlying layer, wherein the first epi layer has a minimized epi doping concentration of a first conductivity type; and implanting an active area of the first epi layer with a first doping concentration of a first conductivity type, wherein the minimized epi doping concentration is less than or equal to approximately half of the particular doping concentration. The method includes forming a device layer of the SiC device by: forming a second epi layer on the first epi layer, wherein the second epi layer has the minimized epi doping concentration of the first conductivity type; implanting an active area of the second epi layer with the particular doping concentration of the first conductivity type; forming a plurality of device features in the active area of the second epi layer; and implanting a termination area of the second epi layer with a first plurality of floating regions having the second conductivity type to form a first junction termination of the SiC device in the device layer.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
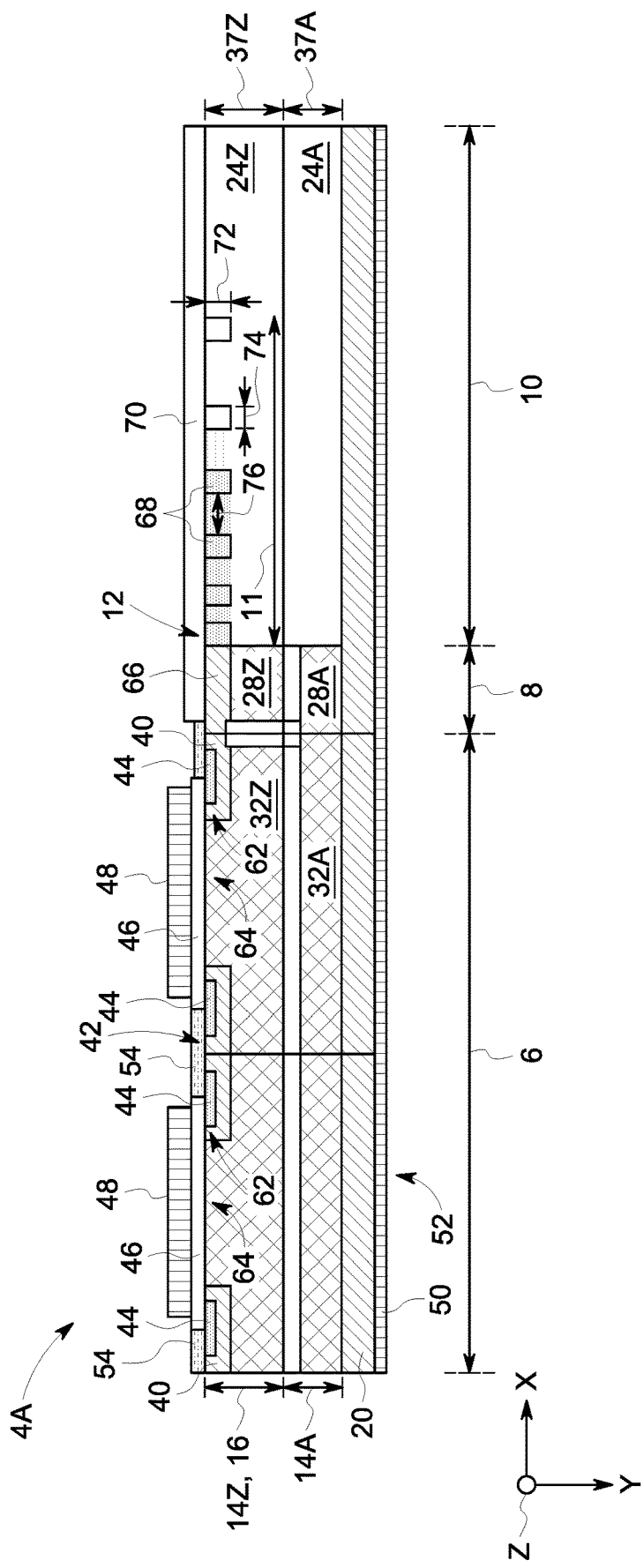
FIG. 1 is a schematic illustrating a cross-sectional view of a portion of an embodiment of a multi-layer silicon carbide (SiC) device having a termination area that includes a junction termination with floating regions of doping, in accordance with the present approach.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also when introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. If ranges are disclosed, the endpoints of all ranges directed to the same component or property are inclusive and independently combinable. The modifier "about" used in connection with a quantity is inclusive of the stated value and has the meaning dictated by the context (e.g., includes the degree of process variations or errors associated with measurement of the particular quantity). The modifier "substantially," when used in combination with a descriptive term, is intended to convey that the descriptive terms mostly, mainly, or predominately applies (e.g., applies to greater than 90%, greater than 95%, or greater than 99% of the time), and may be used to account for limited exceptions that may result from process variations and technical limitations understood by those of the art.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise. The term "adjacent" as used herein means that the two layers or features are disposed contiguously and in direct contact with each other. In the present disclosure, when a layer/device is being described as "on" another layer or substrate, it is to be understood that the layers/devices can either be directly contacting each other or have one (or more) layer or feature between the layers and devices. Further, the term "on" describes the relative position of the layers/devices to each other and does not necessarily mean "on top of" since the relative position above or below depends upon the orientation of the device to the viewer. Moreover, the use of "top," "bottom," "above," "below," "upper", "buried" and variations of these terms is made for convenience and does not require any particular orientation of the components unless otherwise stated. With this in mind, as used herein, the terms "lower," "buried," "middle," or "bottom" refer to a feature (e.g., epitaxial layer, termination area) that is relatively nearer the substrate layer, while the terms "top" or "upper" refer to the particular feature (e.g., epitaxial layer, termination area) that is relatively the farthest from the substrate layer.

Present embodiments are directed toward designs and methods for manufacturing power devices, such as SiC power devices. The disclosed designs and methods are useful in the manufacture of semiconductor devices, such as metal-oxide-semiconductor field-effect transistors (MOSFETs), junction field effect transistors (JFETs), bipolar junction transistors (BJTs), diodes, as well as other devices that may be useful for medium-voltage (e.g., 2 kV-10 kV) and high-voltage (e.g., greater than or equal to 10 kV) power conversion related applications. As discussed below, the disclosed device designs include multi-layered termination areas implemented using repeated epitaxial growth and dopant implantation steps. As used herein, the term "multi-layered," as well as references to a particular number of layers, for example, "two-layered," "three-layered," "four-layered," refer to the number of epitaxial layers, also referred to herein as epi layers.

More specifically, present embodiments are directed toward designs and methods for manufacturing terminations, such as junction terminations, for wide-bandgap (e.g., SiC) power devices. As mentioned, junction terminations are termination structures that employ p/n junctions, either floating or electrically attached to the primary blocking junction, as the means for shaping and controlling the electric field surrounding the device active area. Generally, the disclosed termination designs satisfy a number of design parameters to provide effective edge termination for a wide-bandgap power device. For example, the disclosed termination designs can provide breakdown voltages that are close to or at (e.g., 90%+) device entitlement while reducing termination widths. The disclosed termination designs are also relatively robust to process variations (e.g., dopant concentration in the implanted regions, dopant concentration in the epitaxial layers, doping activation percentage, etc.). The disclosed termination designs consume a relatively smaller portion of the die area, relative to typical junction termination designs, and are relatively low-cost to fabricate. For example, certain disclosed device embodiments may be manufactured using common semiconductor fabrication equipment, such as high-volume ion implantation systems used by existing Si/SiC device manufacturing, to provide additional cost benefits.

As discussed in detail below, the disclosed termination designs include one or more regions of n-type and/or p-type doping arranged in specific ways to form a junction termination, such as a junction termination extension (JTE), to allow gradual reduction of the magnitude of the electric field outside of the active area (e.g., a conductive region) of a power device under high breakdown voltage operation. In various embodiments, these regions of doping may be implemented as disconnected blocks, continuous pillars, stripes, segments, grids, dots, or any other suitable shape. In certain embodiments, these regions of doping may be described as "floating," meaning that they are in not in electrical contact with a device terminal or under an external applied bias; however, in other embodiments at least a portion of these regions may be in electrical contact with a device terminal. The positions and dimensions of these implanted regions in the termination area of the disclosed devices are designed to achieve a high blocking voltage, to prevent premature device breakdown that results from electric field crowding effects, and to allow reliable operation of these devices particularly when subjected to long-term high-temperature/high-voltage operation. Moreover, by controlling the doping of epitaxial (epi) layers within the active area of a device using high-energy ion implantation, for example, and by controlling the doping of the termination area of the device, the disclosed termination designs occupy less die area than traditional junction termination designs, substantially increasing the active area to overhead area ratio without a performance penalty in terms of breakdown voltage.

It may be appreciated that, for present embodiments, the epi layers may be formed with the lowest controllable doping level, for example, without any intentional epi doping (e.g., without intentionally introducing any dopants) or at minimal doping level that allows control of the type (N or P) within specified low concentration range. However, it is recognized since impurities, such as nitrogen, may be present in machinery and/or tools used during the epitaxial growth process, the epi layers may still include a low amount of epi doping (e.g., of the first conductivity type, n-type), which is referred to herein a "minimized epi doping concentration." Accordingly, while the epi layers may be formed with no intentional doping concentration, the actual epi doping concentration of epi layers may be generally $8.0 \times 10^{13}$ cm$^{-3}$ or more, depending on the equipment used for epitaxial growth. For example, in certain embodiments discussed below, the minimized epi doping concentration of the first conductivity type (e.g., n-type) may be less than $3.0 \times 10^{15}$ cm$^{-3}$, less than $2 \times 10^{15}$ cm$^{-3}$, less than $1 \times 10^{15}$ cm$^{-3}$, or between $8 \times 10^{13}$ cm$^{-3}$ and $2 \times 10^{15}$ cm$^{-3}$. It may be noted that, when the minimized epi doping concentration is used, then at least a portion of the active area of the device is implanted with dopant of the first conductivity type using a high-energy (HE) implantation operation.

As such, unlike other semiconductor devices, since the epi layers are formed with a minimized epi doping concentration, portions of the epi layers that would typically have a higher epi doping (e.g., the active area of the epi layers) are instead implanted using a high energy (HE) implantation operation. Additionally, certain epi layers (e.g., a top/device epi layer) may be implanted twice, once for each conductivity type, to achieve the desired structures (e.g., device structures), wherein the second implant may be performed using a standard energy implantation process. For example, after a first HE implantation, a portion of an active area of an epi layer may have a particular doping concentration (e.g., greater than or equal to $3 \times 10^{15}$ cm$^{-3}$) of the first dopant type. For example, when the first conductivity type is n-type, nitrogen, phosphorous, arsenic, antimony, and/or the like may be used as the dopant. Alternatively, when the first conductivity type is p-type, boron, aluminum, and/or the like may be used as the dopant. Subsequently, a second implantation is used to form regions of the second conductivity type within portions of the active area and the intermediate area. Additional implantation operations may be used in certain embodiments.

With the foregoing in mind, FIG. 1 illustrates a cross-sectional view of an embodiment of a SiC device 4A having an active area 6 and an intermediate area 8, as well as a termination area 10 having a junction termination, such as a junction termination extension (JTE) 12, in accordance with embodiments of the present approach. It may be appreciated that in order to more clearly illustrate certain components of the SiC device 4A, certain commonly understood design elements (e.g., top metallization, passivation, and so forth) may be omitted.

The embodiment of the SiC device 4A illustrated in FIG. 1 includes a number of epitaxial (epi) layers 14 (e.g., 14A and 14Z), which include a device layer 16. While the illustrated embodiment includes two epi layers 14, the SiC device 4A may include any suitable number of epi layers 14 (e.g., 3, 4, 5, 6, or more) to yield a SiC device 4A having a particular desired voltage rating. In some embodiments, the epi layers 14 are generally formed from one or more wide-bandgap semiconductor materials, such as silicon carbide, gallium nitride, diamond, aluminum nitride, and/or boron nitride. The epi layers 14 may be fabricated using repeated cycles of epitaxial overgrowth. As illustrated, the first epi layer 14A is disposed above and adjacent to a substrate layer 20 (e.g., wide-bandgap substrate layer, a SiC substrate layer), and the second epi layer 14Z (e.g., the device epi layer) is disposed above and adjacent to the first epi layer 14A. In other embodiments, the SiC device 4A may include additional epi layers 14 (e.g., 14B, 14C, 14D, and so forth), intervening between the first epi layer 14A and the device epi layer 14Z and/or disposed below the first epi layer 14A.

It may be appreciated that, for present embodiments, the epi layers 14 may be formed with the lowest controllable doping level, for example, without any intentional epi doping (e.g., without intentionally introducing any dopants) or at minimal doping level that allows control of the type (N or P) within specified low concentration range. However, it is recognized since impurities, such as nitrogen, may be present in machinery and/or tools used during the epitaxial growth process, the epi layers 14 may still include a low amount of epi doping (e.g., of the first conductivity type), which is referred to herein as the minimized epi doping concentration, as discussed above. Accordingly, while the epi layers 14 may be formed with no intentional doping concentration, the actual epi doping concentration of epi layers 14 may be generally $8 \times 10^{13}$ cm$^{-3}$ or more (e.g., between $4 \times 10^{13}$ cm$^{-3}$ and $2 \times 10^{15}$ cm$^{-3}$), depending on the equipment used for epitaxial growth.

As such, unlike other semiconductor devices, since the epi layers 14 begin with a minimized epi doping concentration, portions of the epi layers 14A and 14Z are subsequently implanted twice, once for each conductivity type, to achieve the desired structures (e.g., device structures). After the first implantation of the first conductivity type, the device active area 6 and intermediate area 8 of the SiC device 4A have a particular doping concentration (e.g., greater than or equal to $3 \times 10^{15}$ cm$^{-3}$) of the first dopant type that is substantially greater than the minimized epi doping concentration (e.g., between $4 \times 10^{13}$ cm$^{-3}$ and $2 \times 10^{15}$ cm$^{-3}$). For example, when the first conductivity type is n-type, nitrogen, phosphorous, arsenic, antimony, and/or the like may be used as the dopant. Alternatively, when the first conductivity type is p-type, boron, aluminum, and/or the like may be used as the dopant. Subsequently, a second implantation is used to form regions of the second conductivity type within portions of the active area 6 and the intermediate area 8.

Accordingly, termination regions 24 (e.g., termination regions 24A, 24Z) disposed in the termination area 10 of the SiC device 4A may have a first doping concentration of the first conductivity type. Further, intermediate regions 28 (e.g., intermediate regions 28A, 28Z) disposed in the intermediate area 8 of the SiC device 4A may have a second doping concentration of the first conductivity type. Moreover, active regions 32 (e.g., active regions 32A, 32Z) disposed in the active area 6 of the SiC device 4A may have a third doping concentration of the first conductivity type. For instance, as discussed in greater detail below, to define the active area 6 and the intermediate area 8, the doping concentration of the active regions 32 and the doping concentration of the intermediate regions 28 may be greater than the doping concentration of the termination regions 24. For example, in some embodiments, the doping concentration of the first conductivity type in the active regions 32 and the intermediate regions 28 may be greater than or equal to $3 \times 10^{15}$ per cubic centimeter (cm$^{-3}$), such as $1.0 \times 10^{16}$ cm$^{-3}$. For such embodiments, the doping concentration of the first conductivity type in the termination regions 24 (e.g., the minimized epi doping concentration) may be less than or equal to $2.0 \times 10^{15}$ cm$^{-3}$. Moreover, within a certain device area (e.g., the termination area 10, the intermediate area 8, and/or the active area 6,) the doping concentration of the first conductivity type in the portions of the epi layers (e.g., the termination regions 24, the intermediate regions 28, and/or the active regions 32, respectively) may be the same or different.

For the embodiment illustrated in FIG. 1, in the active area 6, a top surface 42 of the device layer 16 includes a well region 40 having a second conductivity type (e.g., a p-well region 40) disposed adjacent to a source region 44 having the first conductivity type (e.g., n-type source region 44). A dielectric layer 46 (also referred to as a gate insulating layer or gate dielectric layer) is disposed adjacent to the device layer 16, and a gate electrode 48 is disposed adjacent to the dielectric layer 46. Further, a drain contact 50 is disposed on the bottom 52 of the SiC device 4A, adjacent to the substrate layer 20. As additionally illustrated in the embodiment of FIG. 1, a source contact 54 is disposed adjacent to the top surface 42 of the device layer 16, and is disposed on a portion of both the source region 44 and the well region 40 of the device layer 14.

During on-state operation of the illustrated SiC device 4A, an appropriate gate voltage (e.g., at or above a threshold voltage ($V_{TH}$) of the SiC device 4A) causes an inversion layer form in a channel region 62, as well as a conductive path to be enhanced in a junction field-effect transistor (JFET) region 64, due to accumulation of carriers, allowing current to flow from the drain contact 50 (e.g., drain electrode, drain terminal) to the source contact 54 (e.g., source electrode, source terminal) within portions of the active area 6 and/or in the intermediate area 8. The channel region 62 may be generally defined as an upper portion of the well region 40 disposed below the gate electrode 48 and the dielectric layer 46.

For example, in some embodiments of the SiC device 4A, the respective thicknesses 37A and 37Z of each of the epi layers 14A and 14Z is less than or equal to 20 μm, such as between 5 μm and 20 μm, between 2 μm and 12 μm, between 5 μm and 12 μm, between 10 μm and 12 μm, or the like. Further, it should be appreciated that the doping of the epi layers 14 and the thicknesses 37 of the epi layers 14, among other properties, may be varied for different embodiments to enable desired electrical performance (e.g., desired breakdown voltage) of the SiC devices 4. For example, in some embodiments, certain device parameters (e.g., the thicknesses 37 and doping of the epi layers 14) may be selected to provide a breakdown voltage of the SiC device 4A that is between approximately 1 kilovolt (kV) and 10 kV, 1 kV and 5 kV, or any other suitable range.

For the embodiment illustrated in FIG. 1, the termination area 10 includes a junction termination, such as a JTE 12, having the second conductivity type implanted in the termination region 24Z. In some embodiments, the JTE 12 includes a number of implanted regions of a dopant having the second conductivity type (e.g., p-type), that extend a width 11 from the intermediate area 8 and are utilized to reshape the electric field in at least the termination area 10 of the SiC device 4A. In certain embodiments, these implanted regions include floating regions 68, which are be implemented in the form of disconnected, implanted dopant blocks in the SiC device 4A of FIG. 1. When the floating regions 68 are arranged as disclosed, they gradually reduce the strength of the electric field outside of the active area 6 of the SiC device 4A during high-voltage blocking operation. Additionally, the SiC device 4A may also include a number of passivation layers 70 disposed on the device layer 16 in the termination area 10, which may be formed from one or more dielectric materials that aid in reducing the electric field above the device layer 16.

As mentioned, the floating regions 68 of the illustrated SiC device 4A are regions having opposite conductivity type relative to the minimized epi doping of the epi layer 14Z (e.g., the termination region 24Z), in which they reside.

When the embodiment of the SiC device 4A illustrated in FIG. 1 is in an OFF-state under reverse bias, floating regions 68 deplete to provide ionized dopants (e.g., immobile charges) that, when suitably sized, shaped, and positioned relative to the X-axis and the Z-axis, allow the electric field to be reshaped within periphery of the SiC device 4A (e.g., within the termination area 10). More specifically, when floating regions 68 deplete under reverse bias, they block (e.g., mitigate, prevent) electric field peaks and provide electric field distributions with a magnitude that gradually decreases with increasing distance from the active area 6 of the SiC device 4A. The particular electric field distribution in the termination area 10 of the SiC device 4A under reverse bias depends, for example, on the distribution of dopants (e.g., dopant concentration, the dimensions and positions of the floating regions 68).

For the embodiment of the SiC device 4A illustrated in FIG. 1, the floating regions 68 have a particular depth 72. In other embodiments, the floating regions 68 may extend through the entire thickness of the device epitaxial layer 14Z (e.g., thickness 37Z). Additionally, for the illustrated embodiment of FIG. 1, the widths 74 of the floating regions 68, and the spacing 76 between the floating regions 68 in the termination area 10 changes (e.g., decreases or increases) with increasing distance from the active area 6 of the SiC device 4A to provide a gradual decrease in effective sheet doping concentration in the termination area 10. It may be appreciated that, in other embodiments, the widths 74 of the floating regions 68 substantially decrease with increasing distance from the active area 6, while the spacing 76 between the floating regions 68 remains substantially constant. In still other embodiments, the spacing 76 between the floating regions 68 substantially increases with increasing distance from the active area 6, while the widths 74 of the floating regions 68 remains substantially constant. Further, in certain embodiments, the SiC device may include at least one additional JTE 12 in at least one buried epi layer (e.g., epi layer 14A). In such embodiments, the floating regions 68 of each epi layer 14A and 14Z may have different depths 72, widths 74, and spacing 76. Additionally, in certain embodiments, multiple masking/lithographic steps may be used to fabricate the JTE 12 of each epi layer 14.

Moreover, in some embodiments, the disclosed floating regions 68 may have one or more properties (e.g., doping, width, depth, spacing, etc.), as described for floating regions in the co-pending U.S. patent application Ser. No. 16/060,549, entitled, "EDGE TERMINATION DESIGNS FOR SILICON CARBIDE SUPER-JUNCTION POWER DEVICES," filed Jun. 8, 2018, the disclosure of which is hereby incorporated by reference in its entirety for all purposes. For example, in some embodiments, the widths 74 of each of the floating regions 68 may be between 0.8 microns (µm) and approximately 5 µm, while the spacing 76 between the floating regions 68 may generally be less than the thickness of the respective epi layer 14 the floating regions 68 are disposed within (e.g., the thickness 37Z of the device epi layer 14Z). Further, the depth 72 of each of the floating regions 68 may be approximately 1 µm. Moreover, the integrated charge (e.g., dose) of the JTE 12 may be between $6 \times 10^{12}$ cm$^{-2}$ and $3 \times 10^{13}$ cm$^{-2}$. For example, in some embodiments, the integrated charge of the device layer JTE 12Z may be $1.6 \times 10^{13}$ cm$^{-2}$.

Additionally or alternatively, in some embodiments, the disclosed JTE 12 and/or floating regions 68 may have one or more properties (e.g., doping, width, depth, spacing, etc.), as described for the JTE and/or the discrete regions, respectively, in the U.S. Pat. No. 9,406,762, entitled, "SEMICONDUCTOR DEVICE WITH JUNCTION TERMINATION EXTENSION," filed May 15, 2013, the disclosure of which is hereby incorporated by reference in its entirety for all purposes. For example, in some embodiments, the effective doping profile of the JTE 12 monotonically decreases as a function of the distance from the intermediate area 8 along the X-axis. That is, for example, each of the floating regions 68 may be separated from another floating region by a respective spacing 76 and/or a respective additional spacing 80 illustrated in FIG. 3, such that the doping profile of the JTE 12 generally decreases with increasing distance from the intermediate area 8 along the X-axis.

The JTE 12 described herein provides an illustrative example of a junction termination, and more specifically, the JTE 12 described herein depicts an illustrative example of a graded zone JTE. However, in some embodiments, the implanted regions having the second conductivity type (e.g., p-type), such as the floating regions 68, may additionally or alternatively be implemented to have one or more properties corresponding to another termination and/or junction termination structure. For instance, the implanted regions may be implemented as a single zone JTE, which may include a single implanted region in contact with the intermediate well region 66, and/or as a multiple zone JTE, which may include two or more connected implanted regions. In some embodiments, the two or more connected implanted regions may have the same or different properties, and at least one of the two or more connected implanted regions may contact the intermediate well region 66. Additionally, in some embodiments, the implanted regions may be implemented to form a multiple floating zone JTE. In such embodiments, a first implanted region may contact the intermediate well region 66, while a set of additional implanted regions, such as the floating regions 68, having different spacing and/or widths may be implanted disconnected from the first implanted region and from one another. Further, in some embodiments, the implanted regions (e.g., the floating regions 68) may be implemented to form a floating field ring (FFR) termination. In such embodiments, the floating regions 68 may be implanted disconnected from one another and disconnected from the intermediate well region 66. Additionally or alternatively, the implanted regions may be implemented to form a space modulated JTE, which may include a first implanted region in contact with the intermediate well region and disconnected from a set of additional implanted regions implanted to form a FFR. Accordingly, it may be appreciated that techniques described herein may be applied to any suitable junction termination, such as a single zone JTE, a multiple zone JTE, a graded JTE, a multiple floating zone JTE, a FFR, a space modulated JTE, and/or the like, and that embodiments described herein are intended to be illustrative and not limiting.

Figure 2:
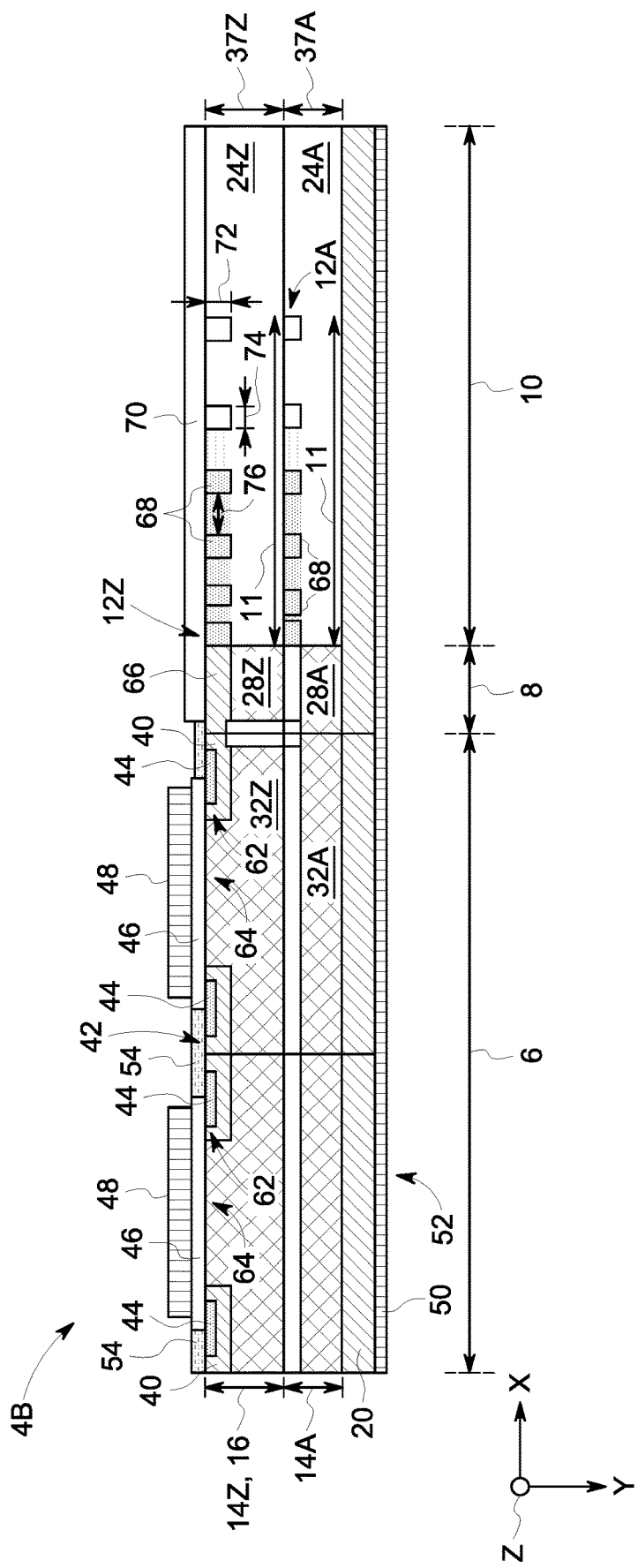
FIG. 2 is a schematic illustrating a cross-sectional view of a portion of another embodiment of a multi-layer SiC device having a termination area that includes junction terminations disposed in in multiple epitaxial (epi) layers of the SiC device, in accordance with the present approach.

Turning now to FIG. 2, in some embodiments, the disclosed SiC devices 4 may include multiple junction terminations, such as multiple JTEs 12. For example, as illustrated, the SiC device 4B includes a first JTE 12A in the epi layer 14A and a second JTE 12Z (e.g., a device JTE) in the same epi layer 14Z as the intermediate well region 66 (e.g., the device layer 16). In some embodiments, the doping profile of the first JTE 12A may be the same as the doping profile of the device layer JTE 12Z. However, in other embodiments, the doping profile of the first JTE 12A may differ from the doping profile of the JTE 12A. For example, in some embodiments, the integrated charge (e.g., dose) of the first JTE 12A may be lower than the integrated charge of the device layer JTE 12Z. For instance, the first JTE 12A may have an effective dose of $9.0 \times 10^{12}$ per square centimeter (cm$^{-2}$), while the device layer JTE 12Z may have an effective dose of $1.6 \times 10^{13}$ cm$^{-2}$. Further, as described above, the SiC devices 4 may include any number of epi layers 14. Accordingly, while the illustrated embodiment includes two JTEs 12 (e.g., 12A and 12Z), it may be appreciated that in some embodiments, the SiC device may include a respective JTE 12 (e.g., 12B, 12C, 12D, and so forth) in each epi layer 14. Alternatively, the SiC device 4B may include a JTE 12 for each of a set of epi layers 14, such that a JTE 12 is adjacent to every other epi layer 14, every third epi layer 14, and/or the like. Thus, embodiments described herein are intended to be illustrative and not limiting.

Figure 3:
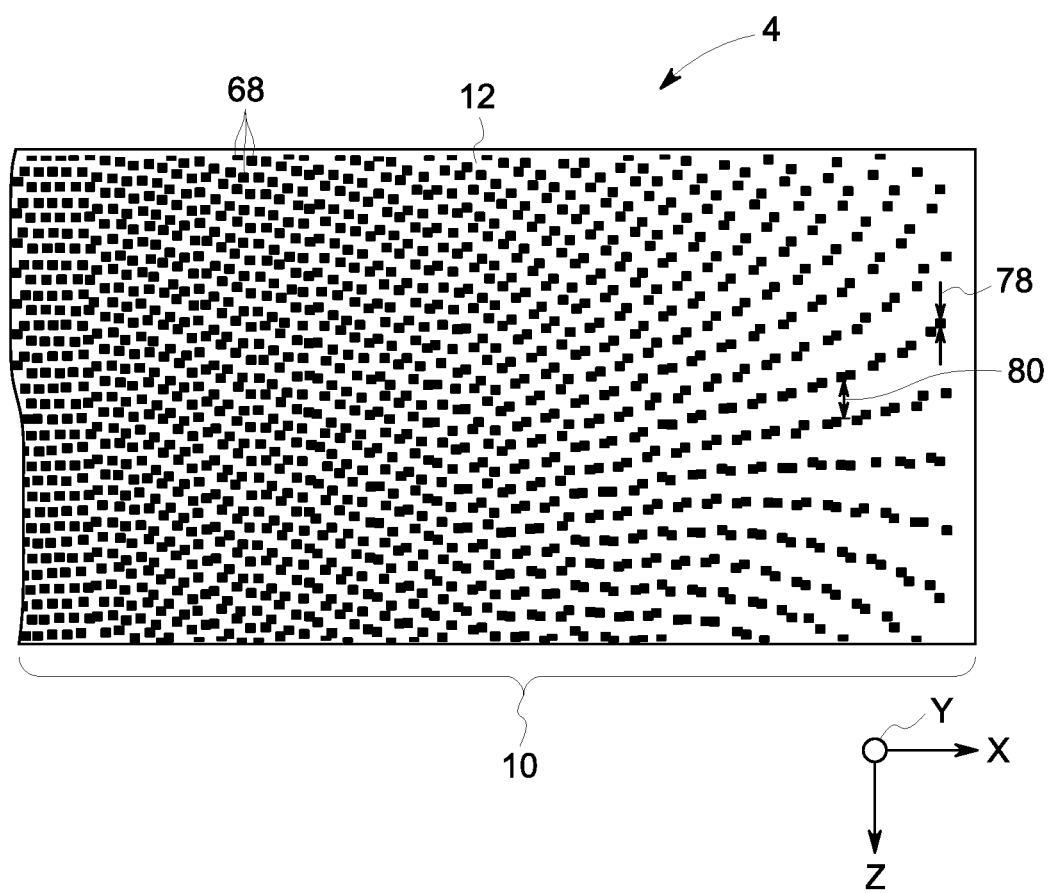
FIG. 3 is a top-down view of the termination area of the embodiment of the multi-layer SiC device of FIG. 1, in accordance with the present approach.

FIG. 3 illustrates a top-down view (perpendicular to the schematic of FIG. 1) of the termination area 10 of the SiC device 4A, in accordance with embodiments of the present approach. More specifically, the illustrated embodiment of the termination area 10 includes a JTE 12 having floating regions 68, implemented as disconnected blocks of doping. For the embodiment illustrated in FIG. 3, each floating region 68 has a particular length 78, as well as additional spacing 80 along the Z-axis. In some embodiments, the length 78 of each floating region 68 may be between 0.8 μm and approximately 5 μm, while the additional spacing 80 between the floating regions 68 may generally be less than the thickness 37 of the respective epi layer 14 the floating regions 68 are disposed within (e.g., the thickness 37Z of the device epi layer 14Z). While the floating regions 68 are illustrated as disconnected blocks, the floating regions 68 may be implemented as disconnected blocks, continuous pillars, stripes, segments, grids, dots, or any other suitable shape. Accordingly, the length 78 and additional spacing 80 between floating regions 68 may vary between certain embodiments. Moreover, as described above, the floating regions 68 may be implemented with properties (e.g., length 78, additional spacing 80, and/or the like) to form an alternative termination and/or junction termination structure. As such, embodiments disclosed herein are intended to be illustrative and not limiting.

Figure 4A:
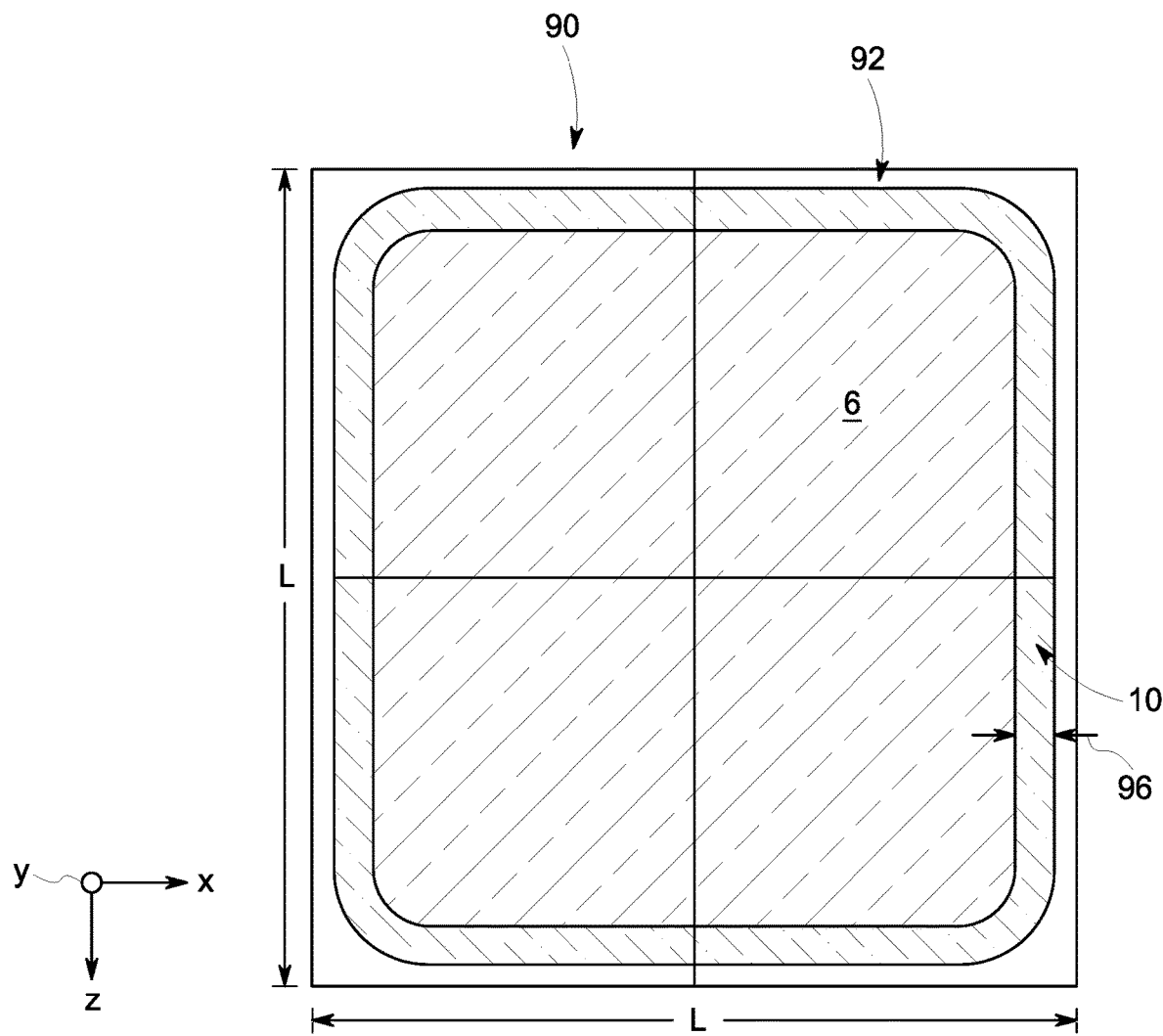
FIG. 4A is a top-down diagram of an embodiment of the multi-layer SiC device having an active area and having a termination area with a junction termination, in accordance with the present approach.
Figure 4B:
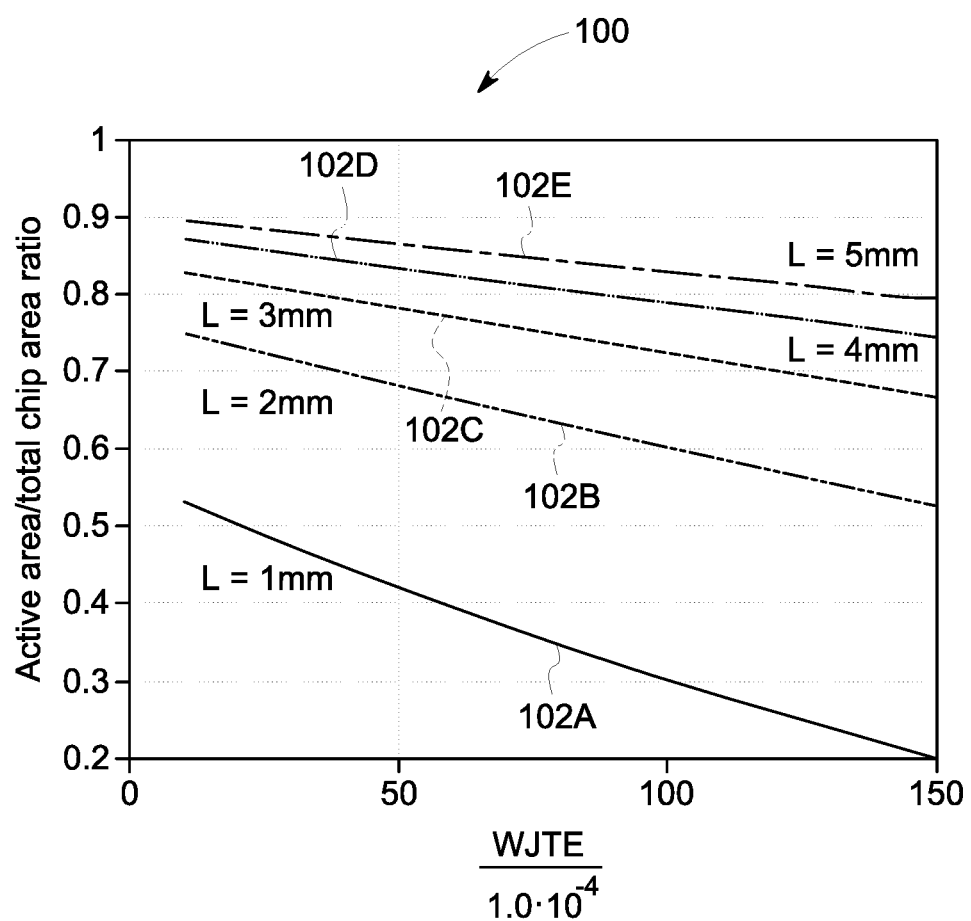
FIG. 4B is a graph illustrating a relationship between an active area to total chip area ratio relative to a width of the junction termination width for the embodiment of FIG. 4A, in accordance with the present approach.

As mentioned, it is recognized that the disclosed approach can also be used to fabricate certain types of power device fabricated using a wide-bandgap material (e.g., silicon carbide (SiC), gallium nitride, diamond, aluminum nitride, and/or boron nitride). FIG. 4A is a top-down diagram of an embodiment of a wide band gap power conversion device 90, such as the SiC device 4A, having a particular length and width, L. The illustrated embodiment of the device 90 includes a fieldstop 92, an active area 6, and a termination area 10 having an associated termination width 96 (also referred to as WJTE for this example). FIG. 4B is a graph 100 illustrating a relationship between an active area: total chip area ratio relative to the termination width 96 for embodiments of the device 90 of FIG. 4A. The curves 102A, 102B, 102C, 102D, and 102E represent different devices 90 having a length/width, L, of 1 millimeter (mm), 2 mm, 3 mm, 4 mm, and 5 mm, respectively.

As indicated by FIGS. 4A and 4B, the active area 6 of the device 90 is generally reduced with increasing termination width 96. Additionally, it also presently recognized that this effect is more pronounced for smaller devices (e.g., curve 102A, L=1 mm) than for larger devices (e.g., curve 102E, L=5 mm). With this in mind, the presently disclosed designs are directed to increasing the active area/total chip area ratio by employing the shortest possible termination width consistent with blocking voltage capability and passivation reliability. That is, a general goal of the design is to maximize the active area of the device (e.g., the portion that carries the current) with respect to the total chip area (e.g., maximize the active area/total chip area ratio, the active area/termination area ratio, and/or the active area/overhead area ratio). It should be noted that the termination and other overhead items, such as the gate pad (not illustrated), the gate runner (not illustrated), and the field stop 92, have associated dimensions that also can affect the active area/overhead area ratio, especially for smaller chip sizes.

Figure 5:
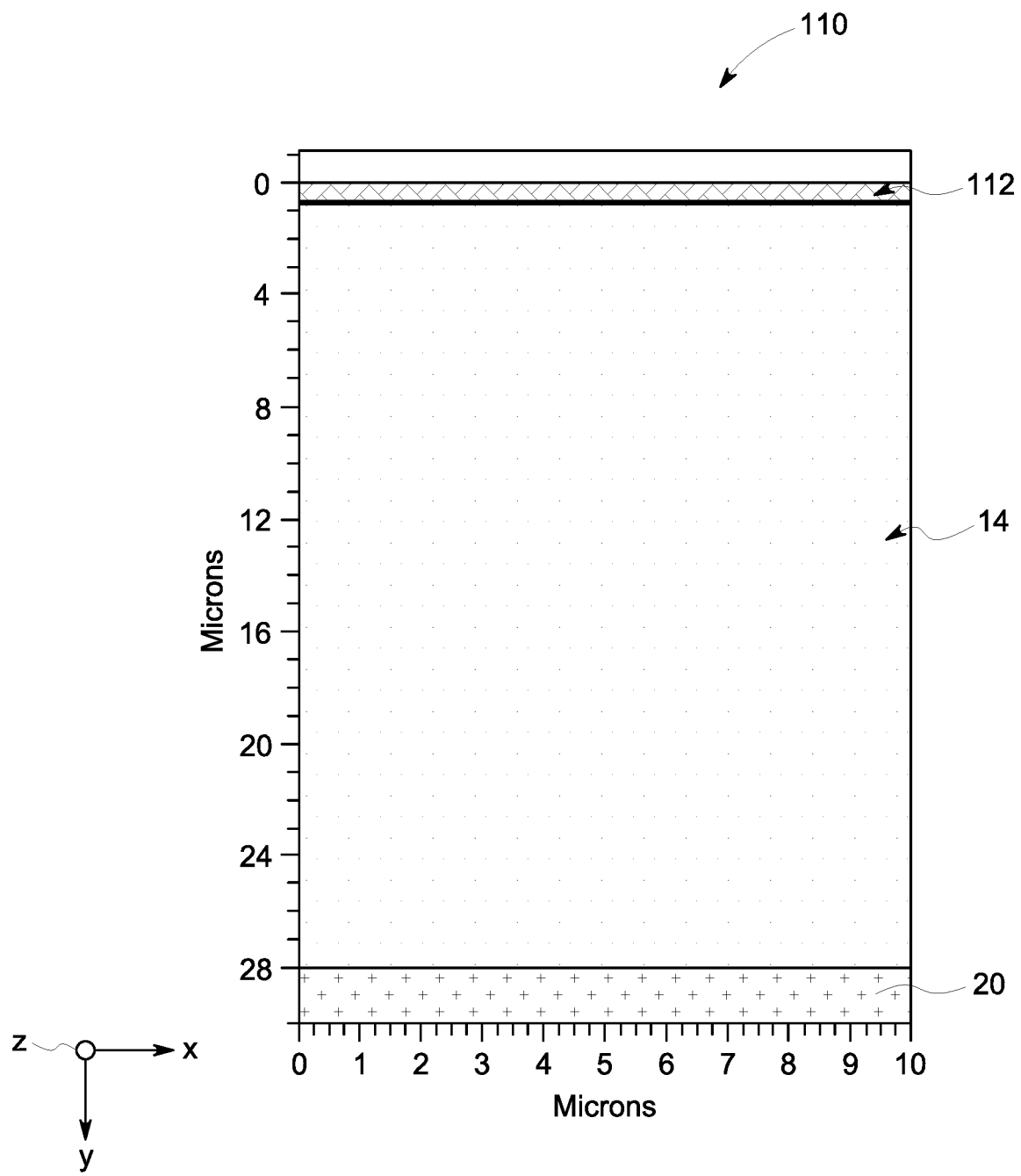
FIG. 5 illustrates a cross-sectional view of the active area of an example embodiment of a SiC power device, in accordance with the present approach.
Figure 6A:
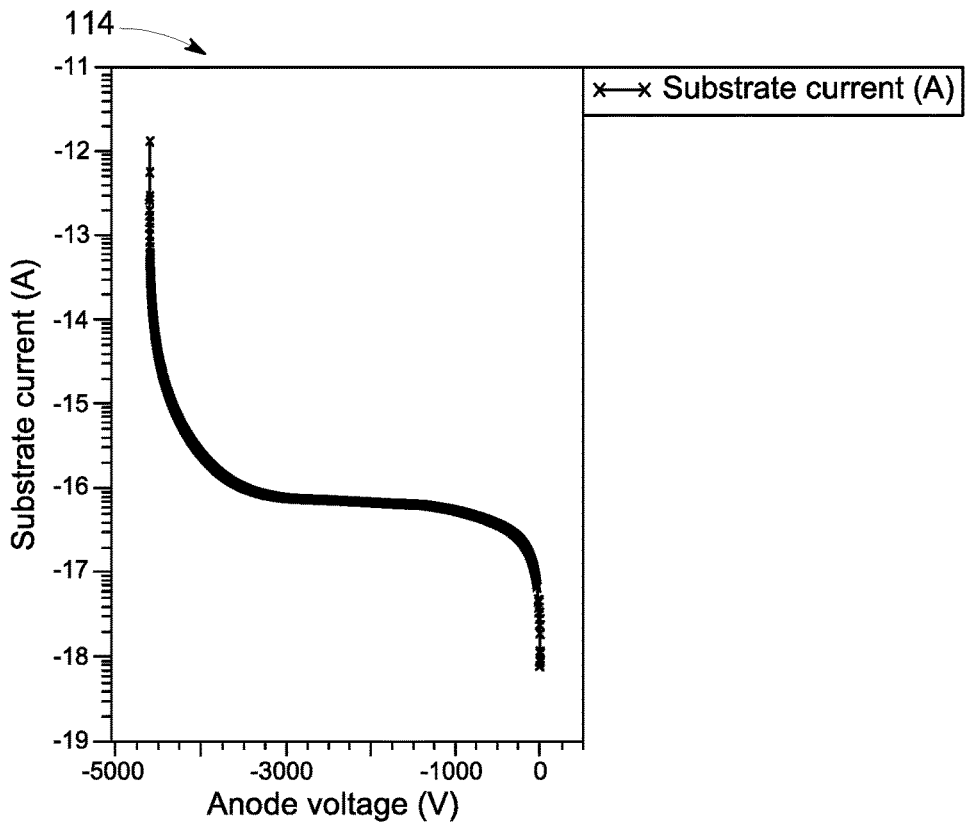
FIG. 6A is a graph illustrating substrate current as a function of anode voltage for the active area of the device structure of FIG. 5, in accordance with the present approach.
Figure 6B:
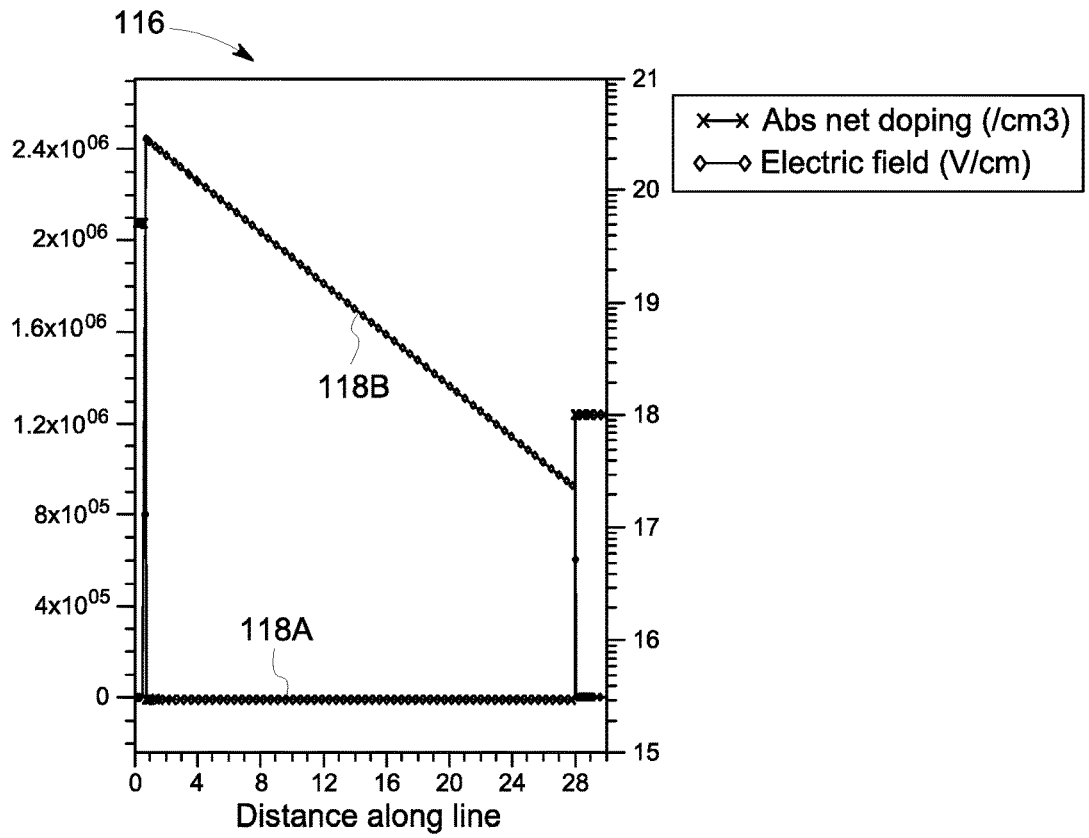
FIG. 6B is a three-axis graph illustrating both absolute doping and electric field strength as functions of depth into the active area for the device structure of FIG. 5, in accordance with the present approach.

FIG. 5 illustrates a cross-section view of the active area 6 of an example embodiment of the SiC power device 110. It may be appreciated that, while the active area 6 of the example SiC power device 110 represents a diode for simplicity and ease of modeling, in other embodiments, active area 6 may include any suitable wide band gap power device structure (e.g., a SiC MOSFET, JFET, etc.). The active area 6 of the example SiC power device 110 has an HE implanted doping concentration of a first conductivity type (e.g., $3.0 \times 10^{15}$ cm$^{-3}$ n-type), one or more epi layers 14 providing a combined epi thickness of 28 micrometers (μm), a uniformly doped junction of the second conductivity type (e.g., p+ junction 112) having a depth of 0.6 μm deep in the top portion of the epi layer (as the blocking junction), and the substrate 20 ($1.0 \times 10^{18}$ cm$^{-3}$ n-type, 2 μm thick SiC). FIG. 6A is a graph 114 illustrating substrate current as a function of anode voltage for the active area 6 of the device 110 of FIG. 5, while FIG. 6B is a graph 116 illustrating absolute net doping (curve 118A, in units per cubic centimeters (cm$^{-3}$)) and electric field strength (curve 118B, in units volts per centimeter (V/cm)) as functions of depth into the one or more epi layers. As indicated by FIGS. 6A and 6B, for the example device 110 of FIG. 5, the 1D blocking voltage entitlement is approximately 4600 volts (V) and the 1D depletion width is 28 μm.

Figure 7A:
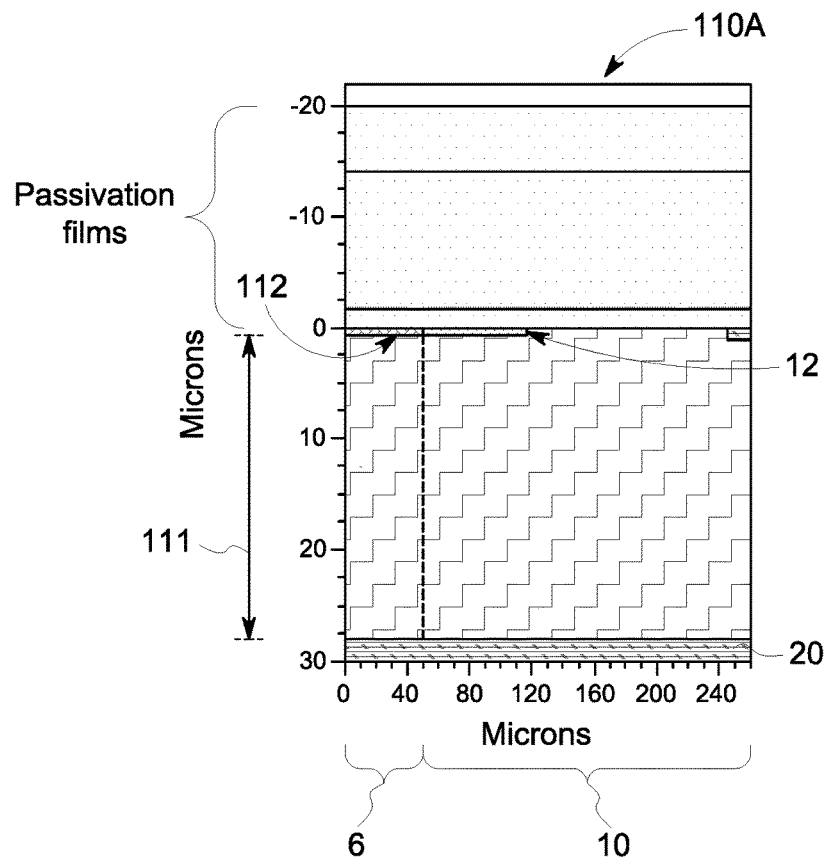
FIG. 7A illustrates an embodiment of a junction termination of a SiC power device formed in a termination area having a conventional epi doping concentration, in accordance with the present approach.
Figure 7B:
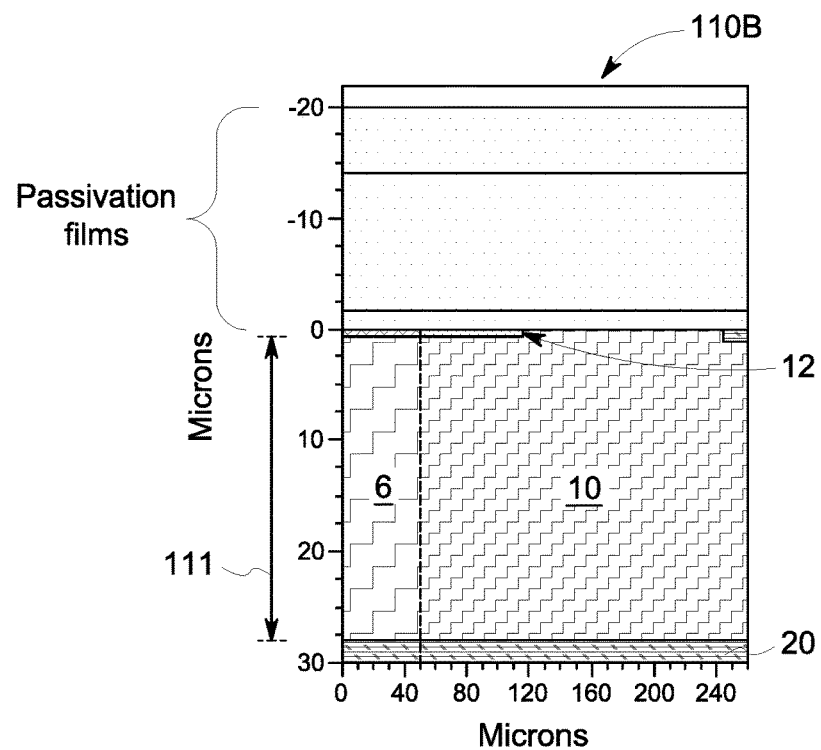
FIG. 7B illustrates an embodiment of a junction termination formed in a termination area having a minimized epi doping concentration, in accordance with the present approach.

FIGS. 7A and 7B illustrate examples of termination areas 10 that can be used in combination with the example active area 6 of the SiC power device 110 illustrated in FIG. 5 or another suitable power device. More specifically, FIG. 7A illustrates a junction termination 12 formed in a termination area 10 having a conventional epi doping level, while FIG. 7B illustrates the termination 12 formed in a termination area 10 having the minimized epi doping concentration, in accordance with present embodiments. As such, the termination area 10 of the device 110B of FIG. 4B has the minimized epi doping concentration of the first conductivity type (e.g., n-type), while the active area 6 of the device 110B has a high-energy implanted doping concentration of $3.0 \times 10^{15}$ cm$^{-3}$ of the first conductivity type. In contrast, the device 110A of FIG. 7A has an epi doping concentration of $3.0 \times 10^{15}$ cm$^{-3}$ in both the active area 6 and the termination area 10 of the device 110A. As illustrated, both devices 110A and 110B have 1D depletion width 111 of 28 μm. Additionally, both devices 110A and 110B include a termination 12, in this case a JTE, having a width of 70 μm (e.g., 2.5× the 1D depletion width 111) and an implantation dose of $1.6 \times 10^{13}$ cm$^{-2}$.

Figure 8A:
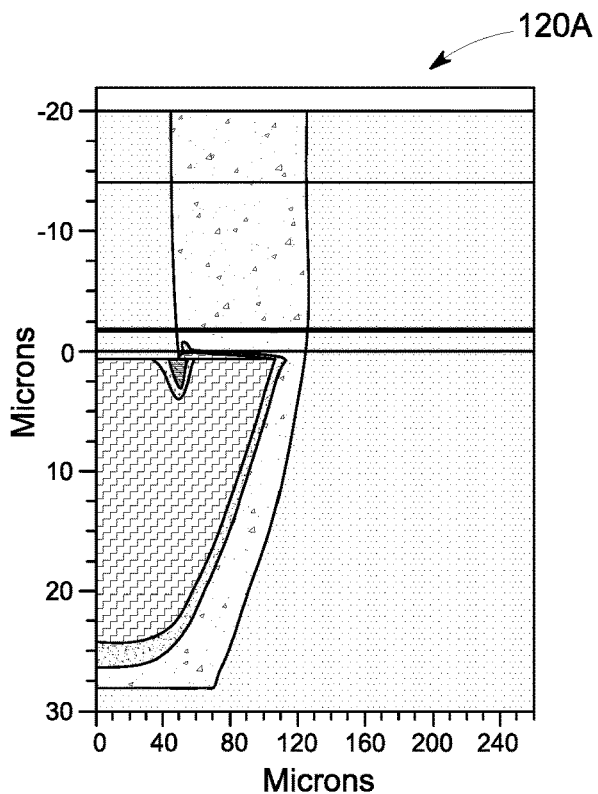
FIG. 8A illustrates the electric field at the rated blocking voltage (3665 V) for the embodiment of the conventionally epi doped SiC device of FIG. 7A, in accordance with the present approach.
Figure 8B:
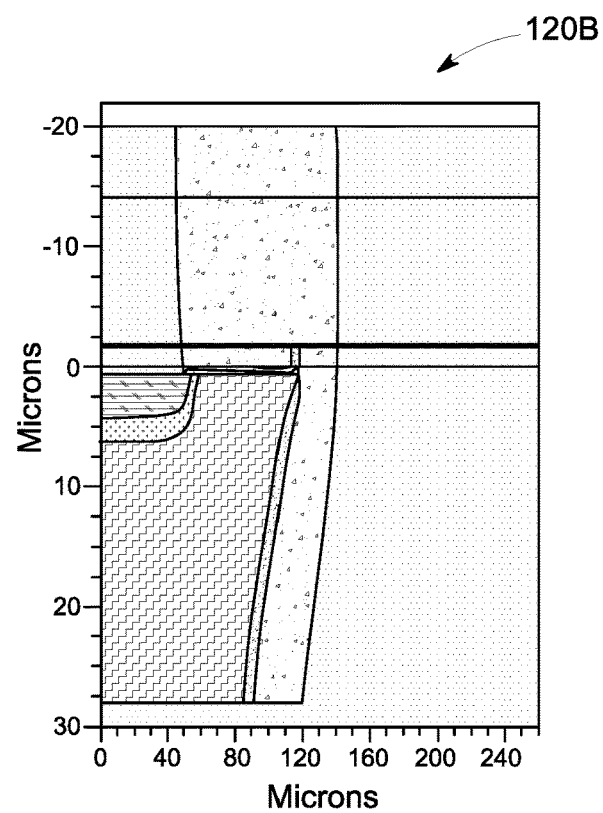
FIG. 8B illustrates the electric field at the rated blocking voltage (4604 V) for the embodiment of the minimally epi doped SiC device of FIG. 7B, in accordance with the present approach.
Figure 9A:
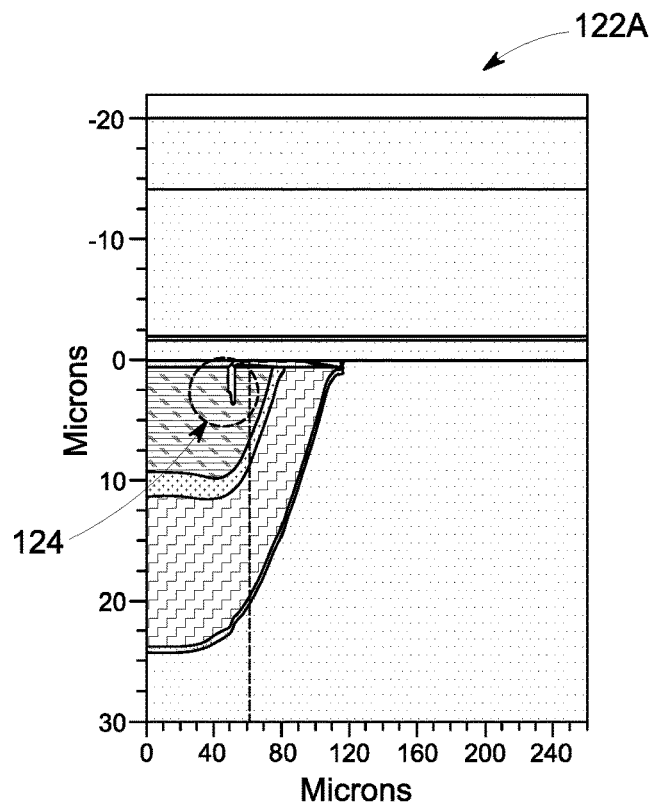
FIG. 9A illustrates impact generation rates at the rated blocking voltage for the embodiment of the conventionally epi doped SiC device of FIG. 7A, in accordance with the present approach.
Figure 9B:
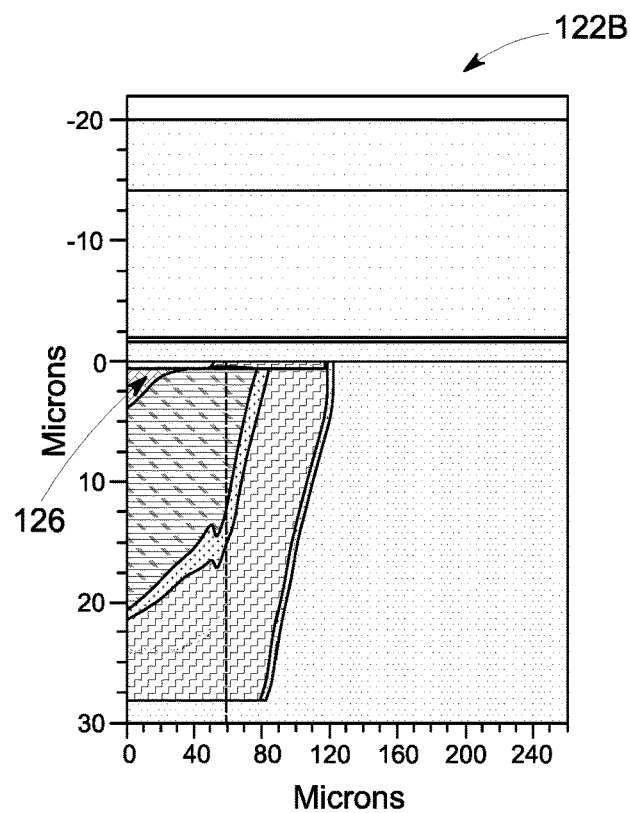
FIG. 9B illustrates the impact generation rates at the rated blocking voltage for the embodiment of the minimally epi doped SiC device of FIG. 7B, in accordance with the present approach.
Figure 10A:
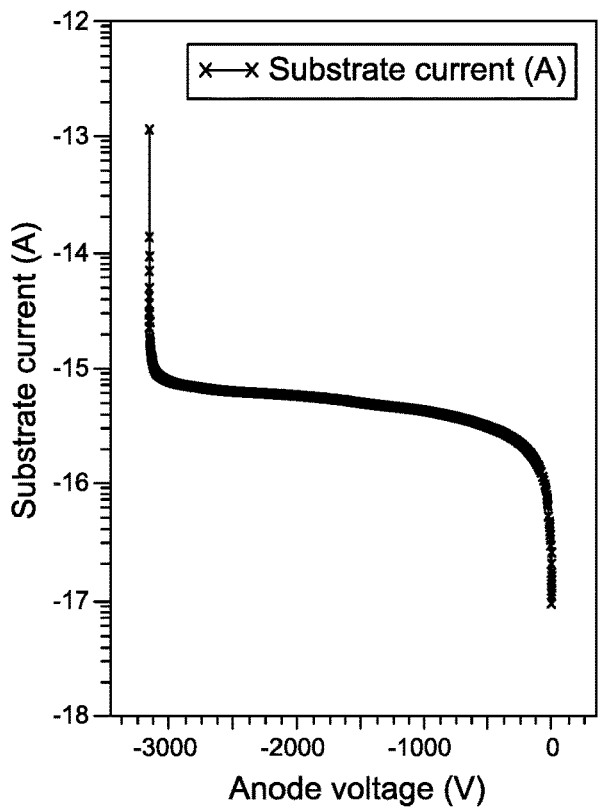
FIGS. 10A, 11A, 12A, 13A, 14A, 15A, and 16A are graphs respectively illustrating substrate current as a function of anode voltage for embodiments of the conventionally epi doped SiC device of FIG. 7A with junction termination widths of 1.5×, 2×, 2.5×, 3×, 4×, 5×, and 6× the 1D depletion width, in accordance with the present approach.
Figure 10B:
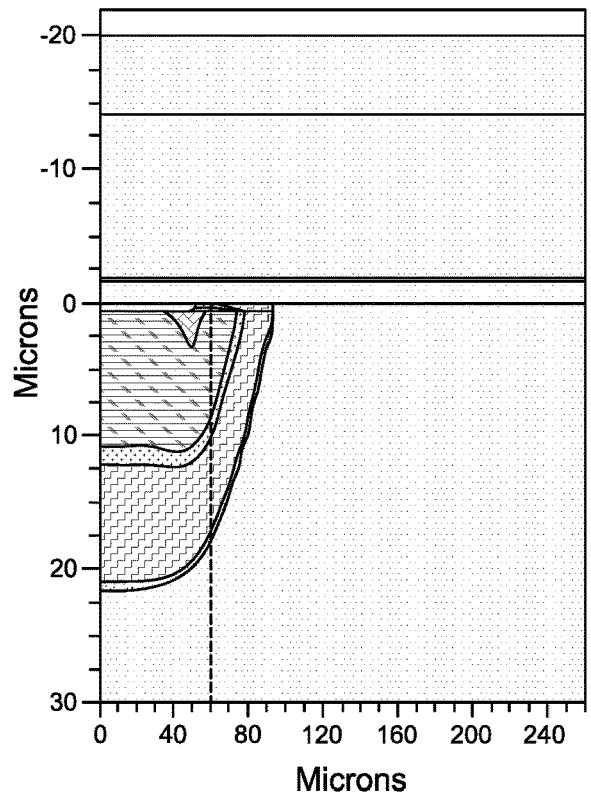
FIGS. 10B, 11B, 12B, 13B, 14B, 15B, and 16B are graphs respectively illustrating corresponding impact generation rates for embodiments of the conventionally epi doped SiC device of FIG. 7A with junction termination widths of 1.5×, 2×, 2.5×, 3×, 4×, 5×, and 6× the 1D depletion width, in accordance with the present approach.
Figure 11A:
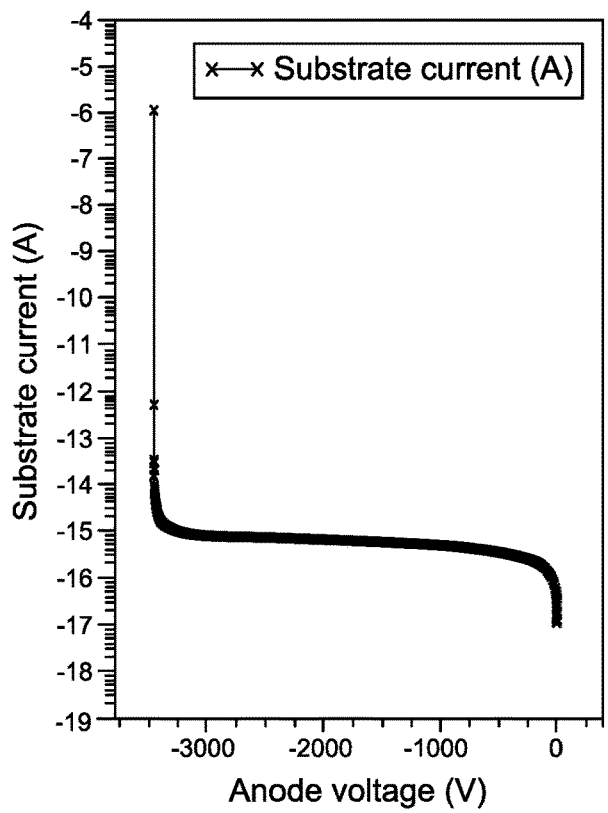
Figure 11B:
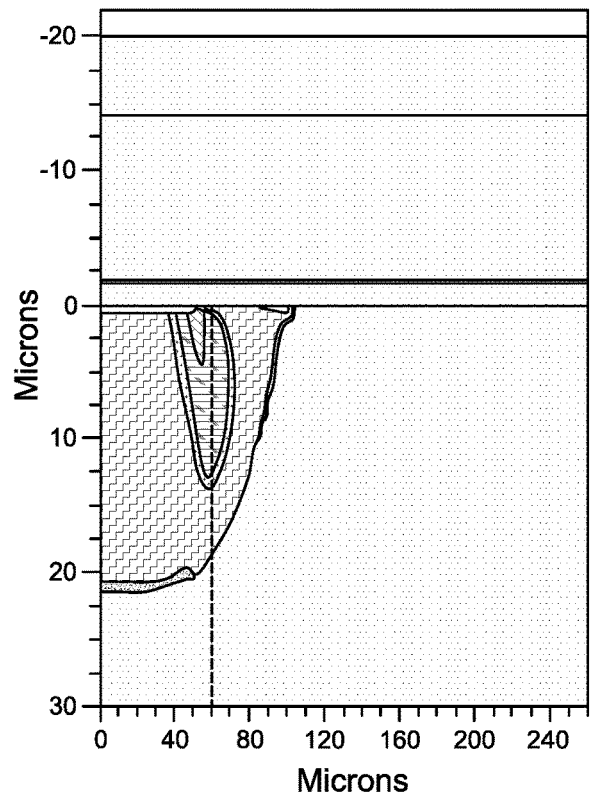
Figure 12A:
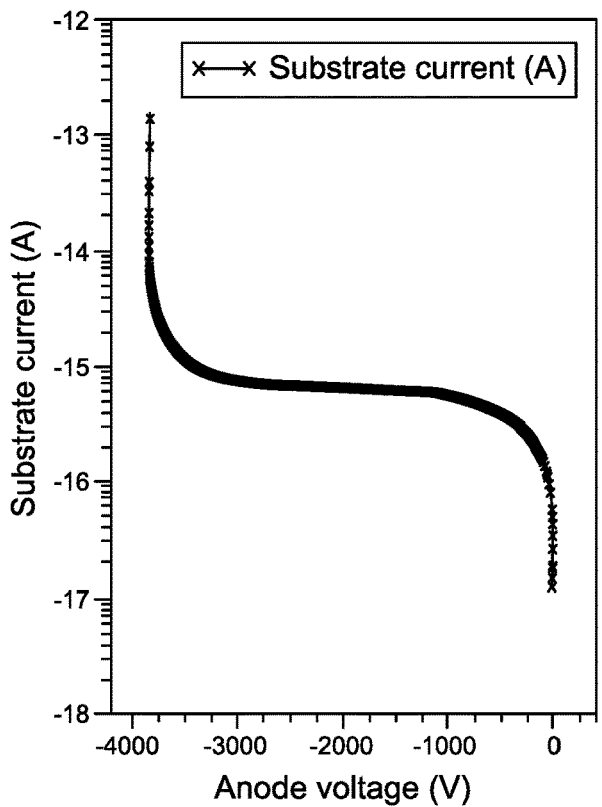
Figure 12B:
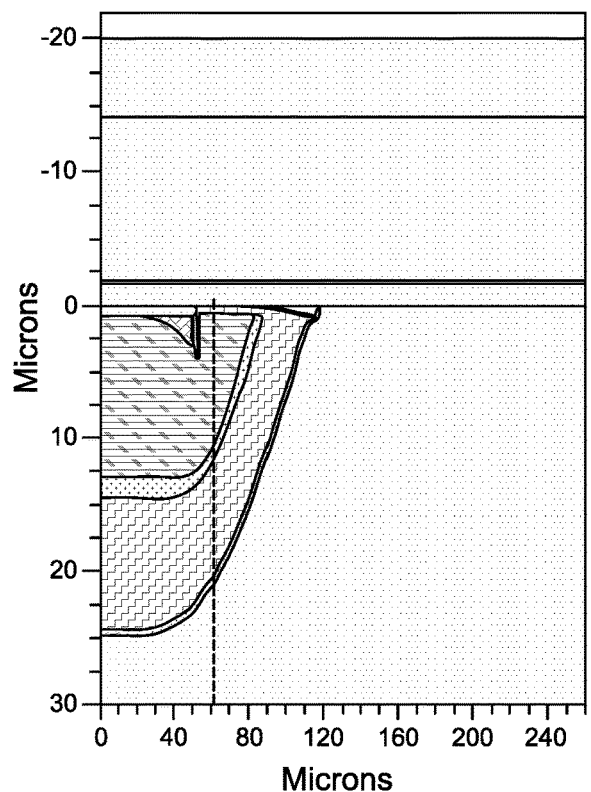
Figure 13A:
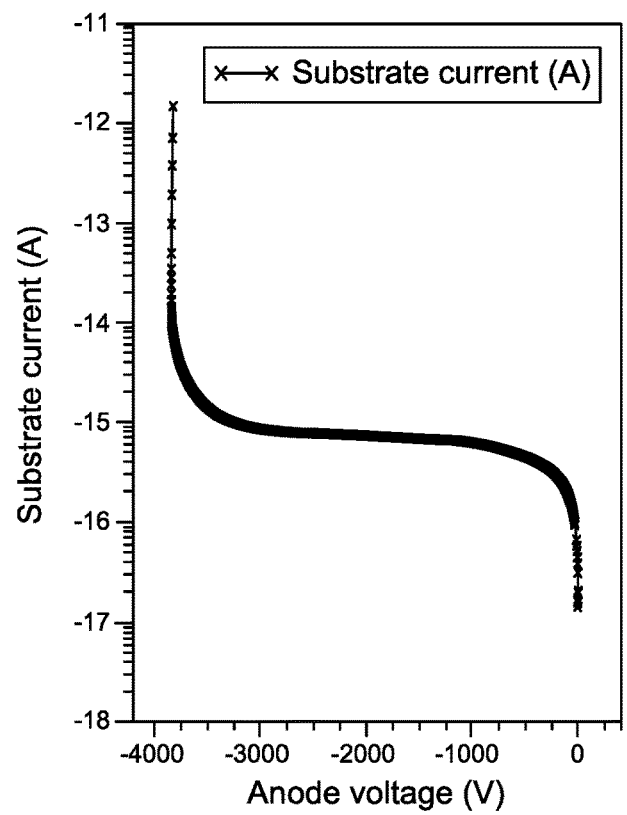
Figure 13B:
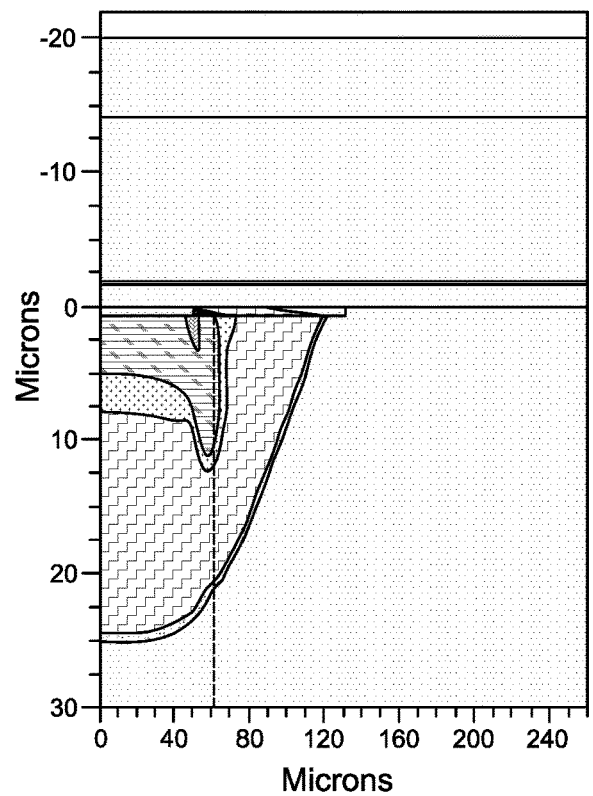
Figure 14A:
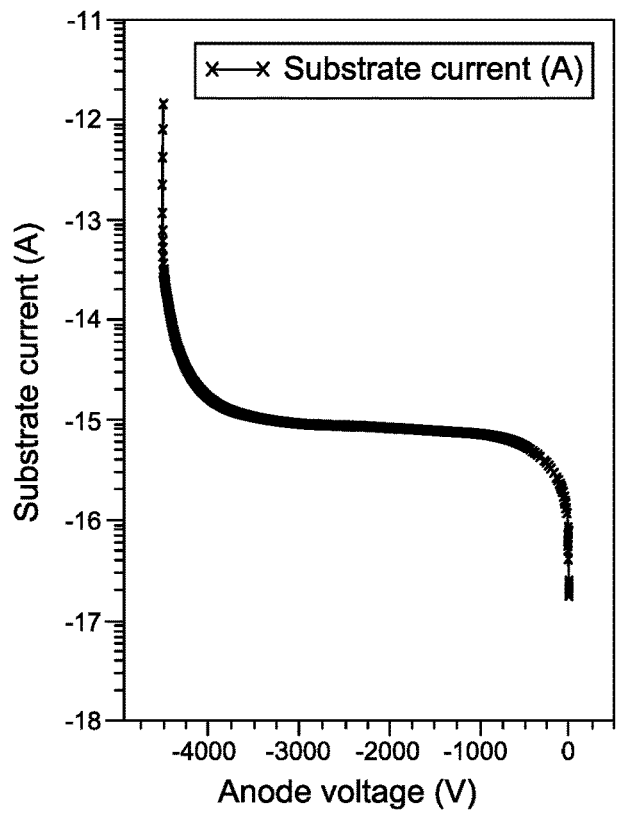
Figure 14B:
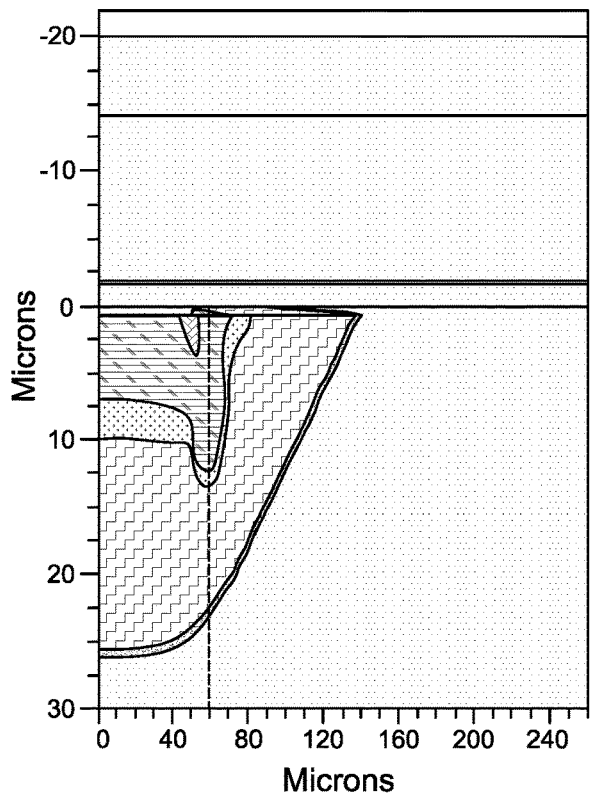
Figure 15A:
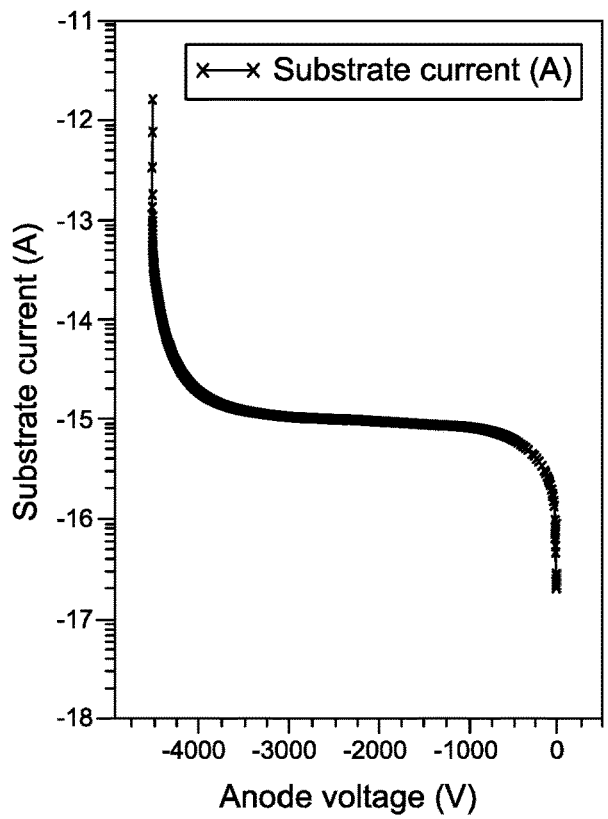
Figure 15B:
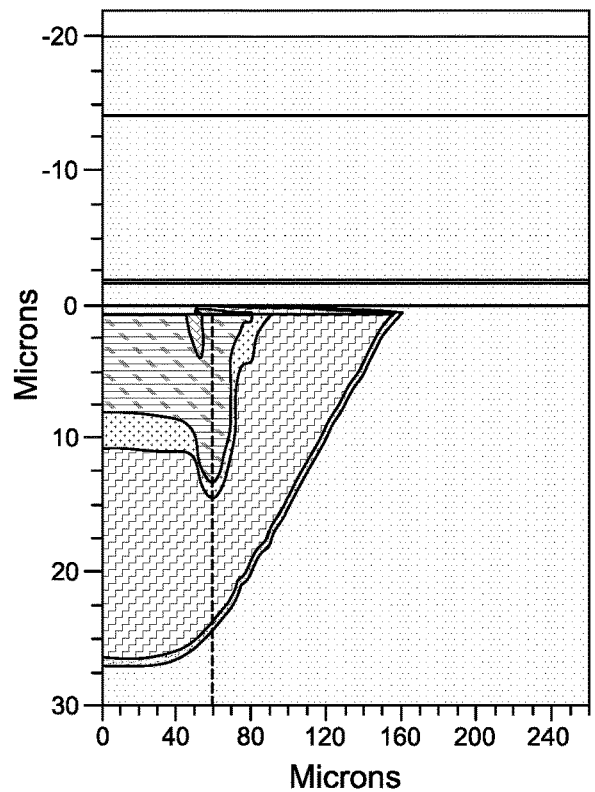
Figure 16A:
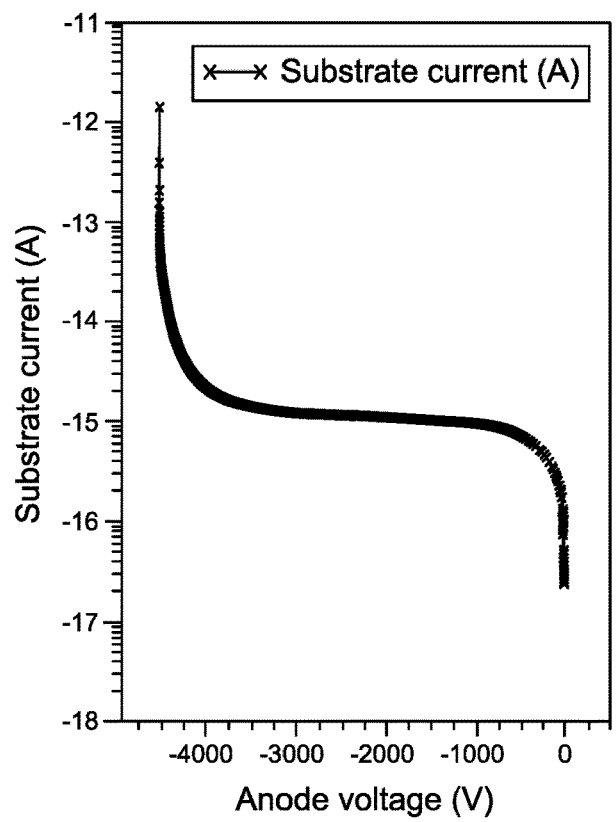
Figure 16B:
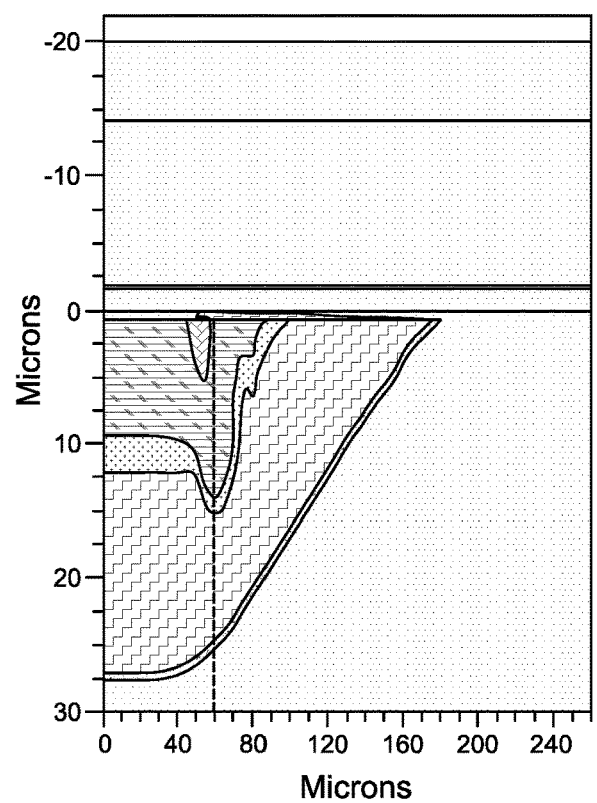
Figure 17A:
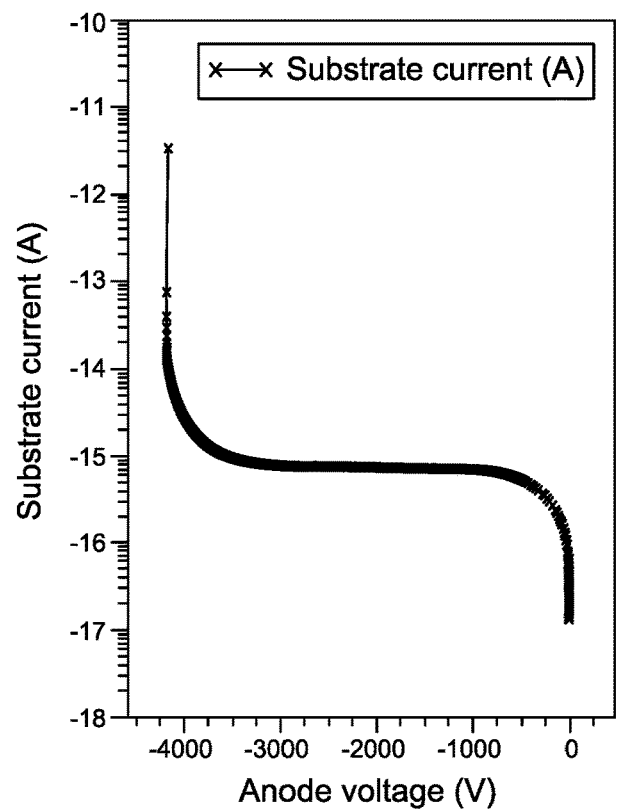
FIGS. 17A, 18A, 19A, 20A, 21A, 22A, and 23A are graphs respectively illustrating substrate current as a function of anode voltage for embodiments of the minimally epi doped SiC device of FIG. 7B with junction termination widths of 1.5×, 2×, 2.5×, 3×, 4×, 5×, and 6× the 1D depletion width, in accordance with the present approach.
Figure 17B:
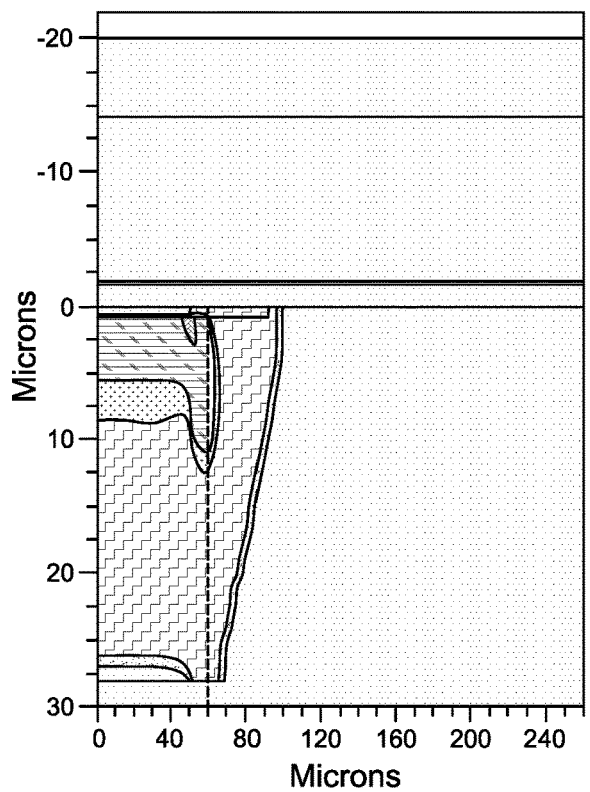
FIGS. 17B, 18B, 19B, 20B, 21B, 22B, and 23B are graphs respectively illustrating corresponding impact generation rates for embodiments of the minimally epi doped SiC device of FIG. 7B with junction termination widths of 1.5×, 2×, 2.5×, 3×, 4×, 5×, and 6× the 1D depletion width, in accordance with the present approach.
Figure 18A:
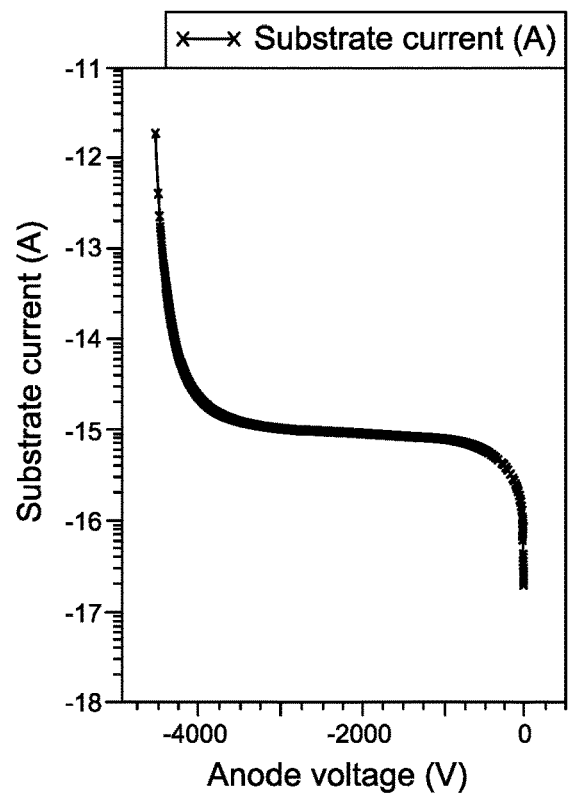
Figure 18B:
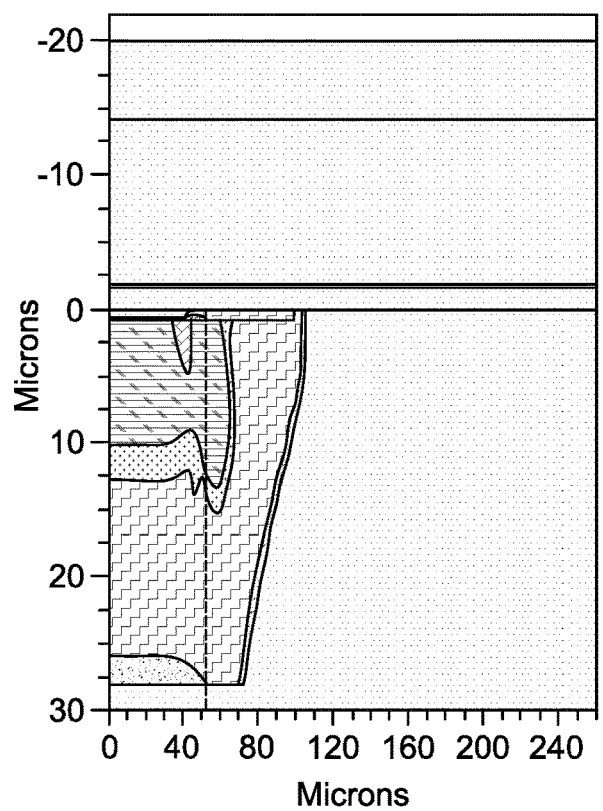
Figure 19A:
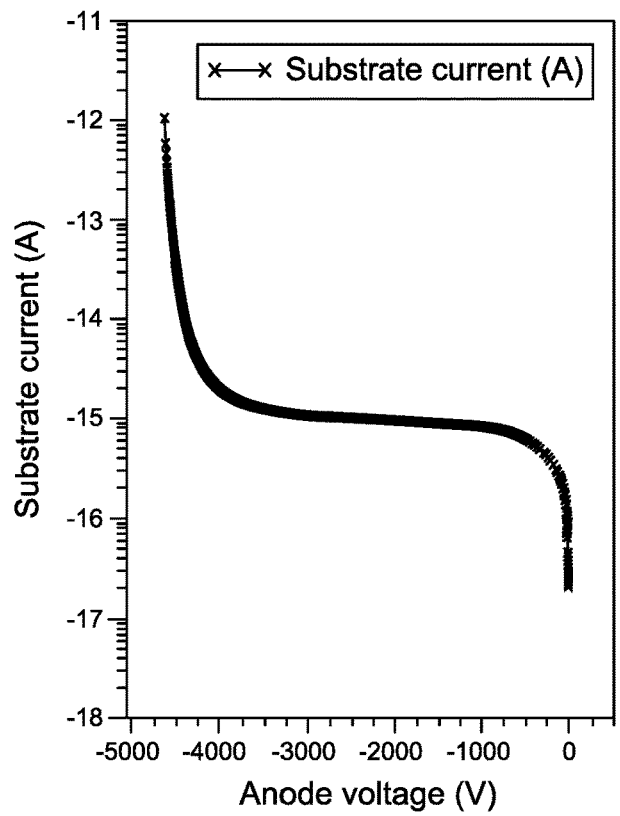
Figure 19B:
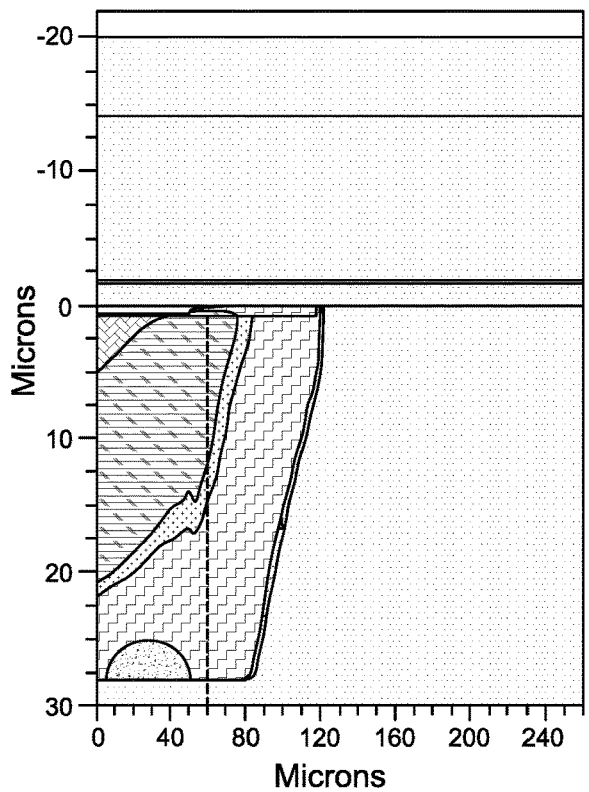
Figure 20A:
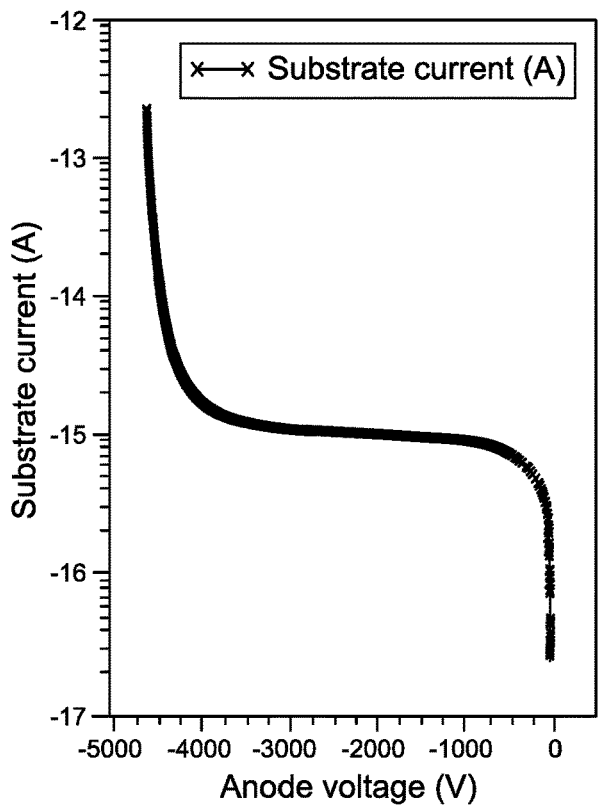
Figure 20B:
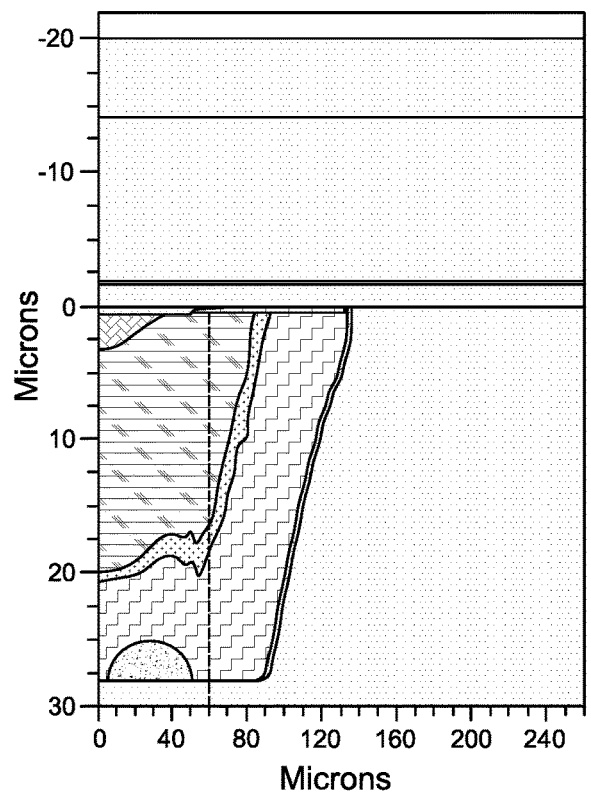
Figure 21A:
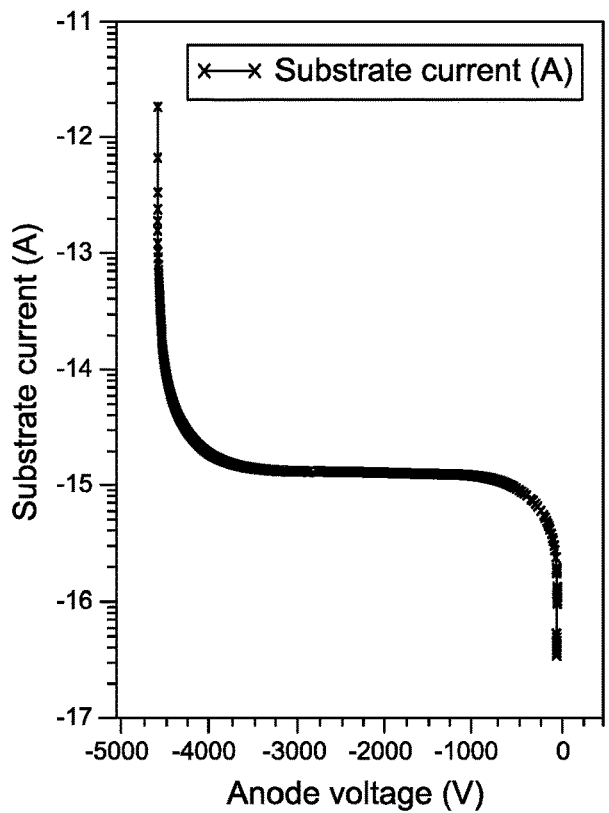
Figure 21B:
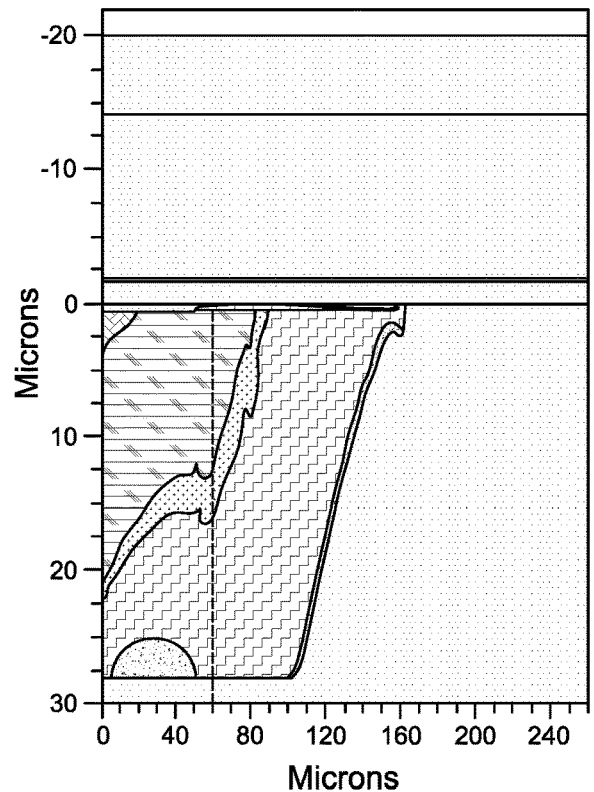
Figure 22A:
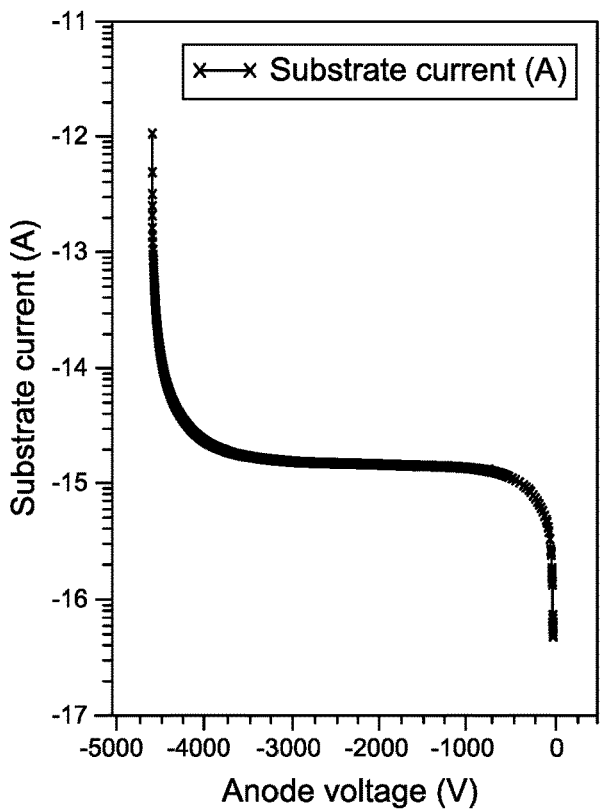
Figure 22B:
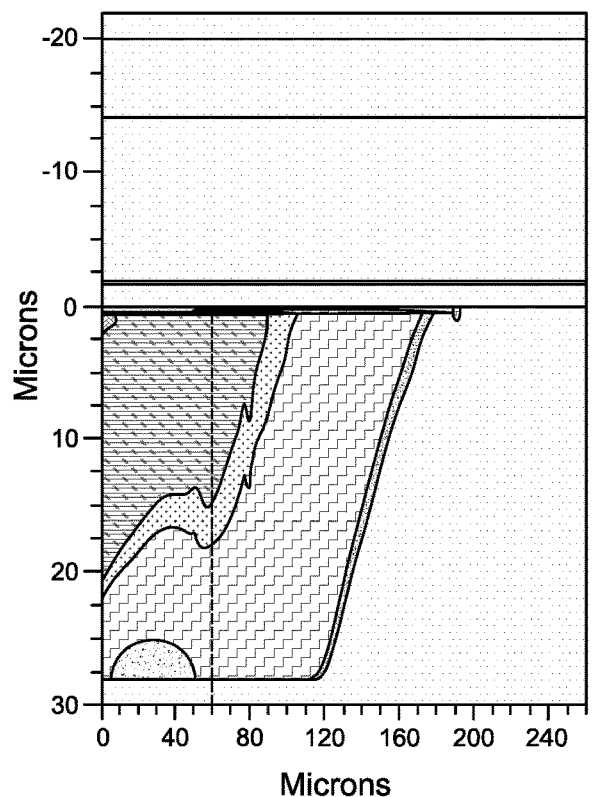
Figure 23A:
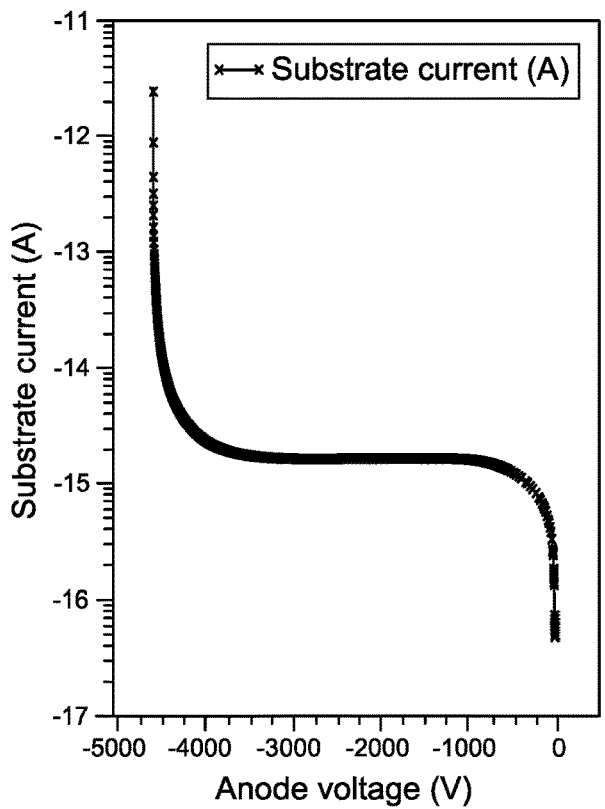
Figure 23B:
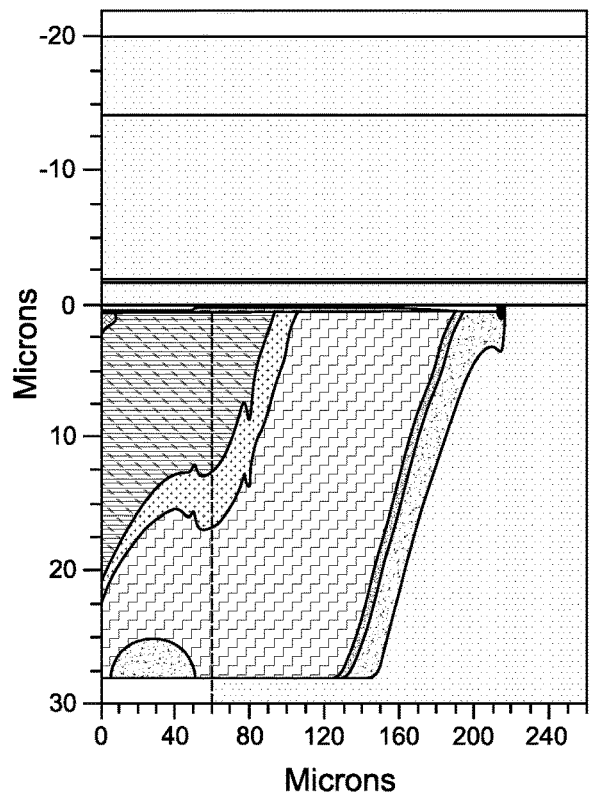

FIG. 8A is a cross-sectional diagram 120A that illustrates the electric field at the rated blocking voltage (3665 V) for the conventionally epi doped SiC device 110A of FIG. 7A, while FIG. 8B in a cross-section diagram 120B that illustrates the electric field at the rated blocking voltage (4604 V) for the example SiC device 110B of FIG. 7B. FIG. 9A is a cross-sectional diagram 122A that illustrates the impact generation rates at the rated blocking voltage for the conventionally epi doped SiC device 110A of FIG. 7A, while FIG. 9B is a cross-sectional diagram 122B illustrates the impact generation rates at the rated blocking voltage for the example SiC device of FIG. 7B. In FIG. 9A, the impact ionization rate is maximum in a local area indicated by the circle 124, while in FIG. 9B, the main blocking junction is desirably avalanching over a wider area, as indicated by the arrow 126.

For SiC devices, like the device 110A of FIG. 7A, having termination areas 10 with conventional epi doping, FIGS. 10A, 11A, 12A, 13A, 14A, 15A, and 16A illustrate substrate current as a function of anode voltage, while FIGS. 10B, 11B, 12B, 13B, 14B, 15B, and 16B illustrate corresponding impact generation rates. More specifically, for FIGS. 10A and 10B the JTE width is 1.5× the 1D depletion width and the blocking voltage (BV) is 3156 V, for FIGS. 11A and 11B the JTE width is 2× the 1D depletion width and the BV is 3448 V, for FIGS. 12A and 12B the JTE width is 2.5× the 1D depletion width and the BV is 3665 V, for FIGS. 13A and 13B the JTE width is 3× the 1D depletion width and the BV is 3827 V, for FIGS. 14A and 14B the JTE width is 4× the 1D depletion width and the BV is 4048 V, for FIGS. 15A and 15B the JTE width is 5× the 1D depletion width and the BV is 4180 V, and for FIGS. 16A and 16B the JTE width is 6× the 1D depletion width and the BV is 4273 V.

By comparison, for SiC devices, like the device 110B of FIG. 7B, having termination areas 10 with the minimized epi doping concentration and the high-energy implanted active area 6, FIGS. 17A, 18A, 19A, 20A, 21A, 22A, and 23A illustrate substrate current as a function of anode voltage, and FIGS. 17B, 18B, 19B, 20B, 21B, 22B, and 23B illustrate corresponding impact generation rates. More specifically, for FIGS. 17A and 17B the JTE width is 1.5× the 1D depletion width and the BV is 4169 V, for FIGS. 18A and 18B the JTE width is 2× the 1D depletion width and the BV is 4495 V, for FIGS. 19A and 19B the JTE width is 2.5× the 1D depletion width and the BV is 4604 V, for FIGS. 20A and 20B the JTE width is 3× the 1D depletion width and the BV is 4600 V, for FIGS. 21A and 21B the JTE width is 4× the 1D depletion width and the BV is 4606 V, for FIGS. 22A and 22B the JTE width is 5× the 1D depletion width and the BV is 4606 V, and for FIGS. 23A and 23B the JTE width is 6× the 1D depletion width and the BV is 4606 V.

Figure 24:
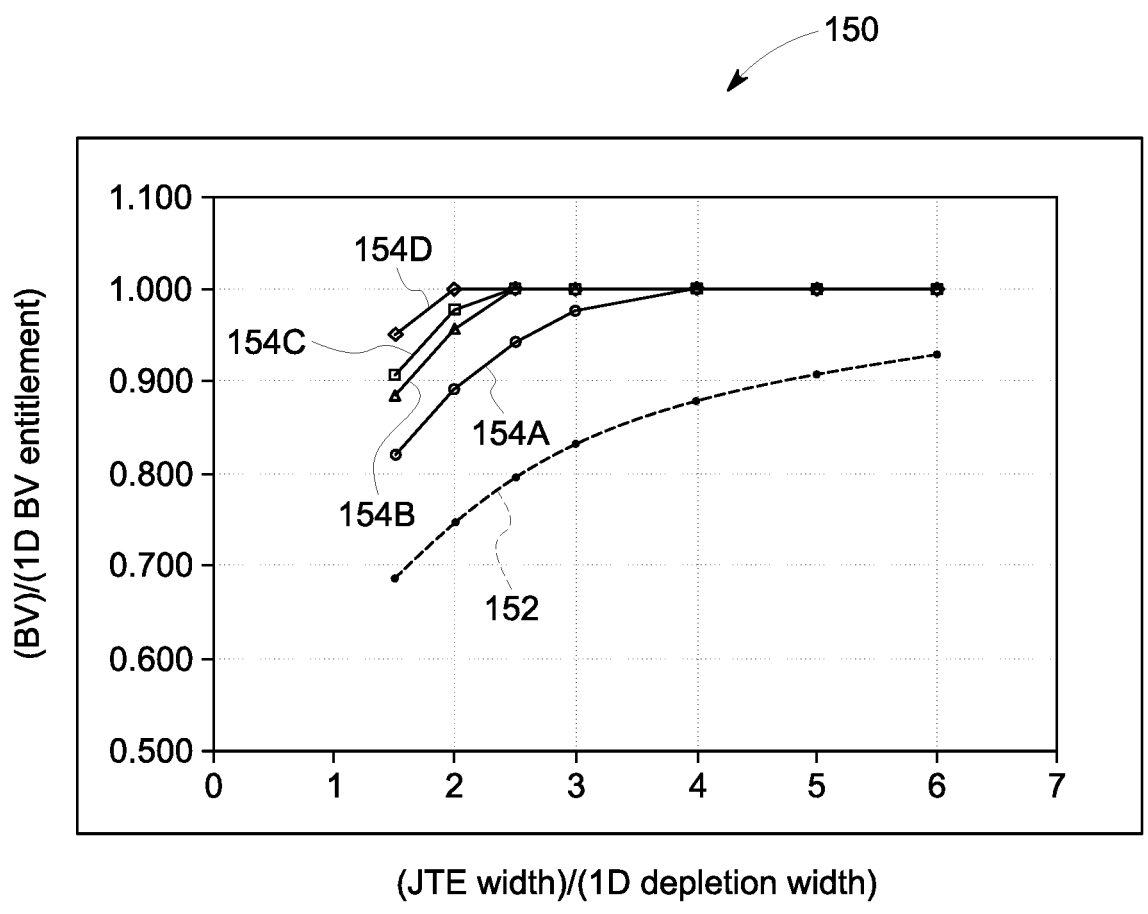
FIG. 24 is a graph plotting a ratio of blocking voltage (BV) to 1D BV entitlement as a function of a ratio of junction termination width to 1D depletion width for the conventionally epi doped SiC device of FIG. 7A and for minimally the epi doped SiC device of FIG. 7B, in accordance with the present approach.

FIG. 24 is a graph 150 that plots a ratio of BV to 1D BV entitlement as a function of a ratio of termination width 96 to 1D depletion width 111 for the conventionally epi doped SiC devices 110A, as represented by FIGS. 10-16, and for embodiments of the disclosed SiC devices 110B having the minimized epi doping concentration and the HE implanted active area 6, as represented by FIGS. 17-23. More specifically, the curve 152 of the graph 150 represents this relationship for the conventionally epi doped SiC device 110A of FIGS. 10-16, which has an epi doping concentration of the first conductivity type (e.g., n-type) in the active area 6 and the termination area 10 that is $3.0 \times 10^{15}$ cm$^{-3}$ at termination widths 96 of 1.5×, 2×, 3×, 4×, 5×, and 6× the 1D depletion width. As such, the curve 152 indicates that, even with a termination width 96 that is 6× the 1D depletion width 111, the conventionally epi doped SiC device only achieves about 92% of the 1D BV entitlement.

The remaining curves 154 of the graph 150 represents the BV:1D BV entitlement ratio as a function of the termination width:1D depletion width ratio for the minimally epi doped SiC devices 110B represented by FIGS. 17-23 at different minimized epi doping concentrations and at termination widths 96 of 1.5×, 2×, 3×, 4×, 5×, and 6× the 1D depletion width 111. More specifically, curve 154A represents a minimized epi doping concentration of $1.6 \times 10^{15}$ cm$^{-3}$, curve 154B represents a minimized epi doping concentration of $2 \times 10^{15}$ cm$^{-3}$, curve 154C represents a minimized epi doping concentration of $8 \times 10^{14}$ cm$^{-3}$, and curve 154D represents a minimized epi doping concentration of $4 \times 10^{14}$ cm$^{-3}$. The curves 154 demonstrate that, with a sufficiently low minimized epi doping concentration (e.g., $8 \times 10^{14}$ cm$^{-3}$ or less), the devices are able to achieve greater than 90% the 1D BV entitlement using a termination width 96 as small as 1.5× the 1D depletion width 111. Additionally, for the embodiments illustrated by the curves 154 in the graph 150, since the doping concentration in the active area 6 is $3 \times 10^{15}$ cm$^{-3}$, then the minimized epi doping concentrations of the curves 154 may be described as being less than approximately half of this doping concentration in the active area 6, or this doping concentration in the active area 6 may be described as being at least twice (2×) (e.g., between 2× and 10×) the minimized epi doping concentration.

As indicated by the graph 150 FIG. 24, it is recognized that there are substantial benefits to using masked HE implant processing to dope the active area 6 of the device to the appropriate doping level (e.g., depending on desired voltage rating) and having the termination area 10 of the epi with the minimized epi doping concentration of the first conductivity type, in accordance with present embodiments. For example, as illustrated in the graph 150, for the disclosed design, 100% of BV entitlement (about 4600 V) can be achieved using a JTE width only 2.5× the 1D depletion width (e.g., 2.5×28 μm=70 μm), vs. only 90% of BV entitlement (about 4140 V) using a JTE 5× the 1D depletion width (5×28 μm=140 μm) for the conventionally epi doped device, and a substantial improvement in chip area efficiency (e.g., an increase in aforementioned active area ratios) is observed. Additionally, it is noted that even a device of the disclosed design having a JTE width as low as 1.5× the 1D depletion width offers a BV similar to a conventional device having a JTE width of 5× the 1D depletion width.

Figure 25:
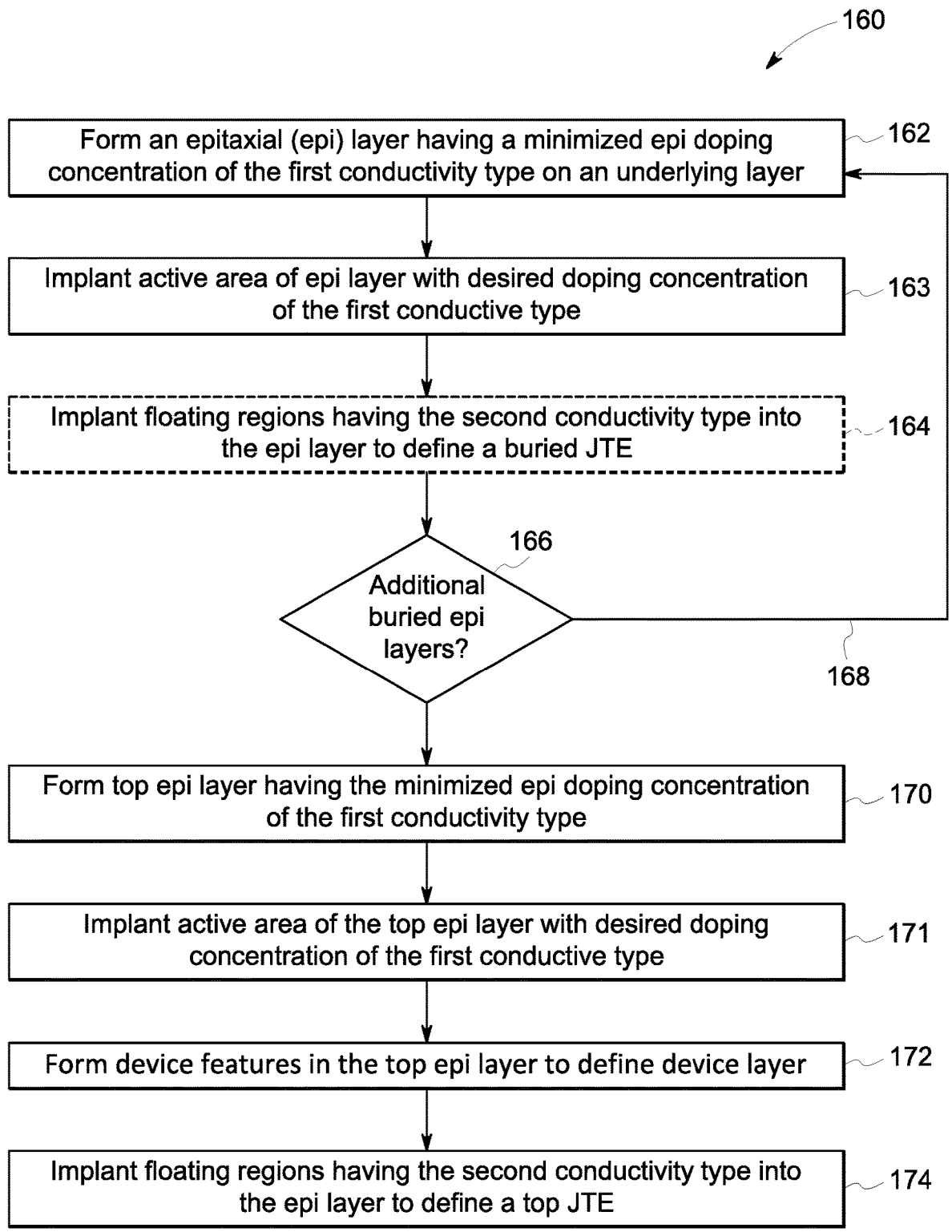
FIG. 25 is flow chart of a process for manufacturing an embodiment of the SiC device having one or more junction terminations, in accordance with an embodiment.

FIG. 25 is a flow diagram of a process 160 for manufacturing an embodiment of the SiC device 4 having one or more junction terminations, such as one or more JTEs 12 (e.g., SiC device 4A or 4B), in accordance with embodiments described herein. Although the following description of the process 160 is described in a particular order, which represents a particular embodiment, it should be noted that the steps of the process 160 may be performed in any suitable order. Further, certain steps may be repeated or skipped altogether, and additional steps may be included in the process 160. The following description of the process 160 is described with reference to embodiments of the SiC device 4A and 4B respectively illustrated in FIGS. 1 and 2.

The illustrated process begins with forming (block 162) an epi layer having the minimized epi doping concentration of first conductivity type on an underlying layer. In some embodiments, the underlying layer may include the semiconductor substrate layer 20. As described above, the substrate layer 20 may be made of silicon, silicon carbide (SiC), gallium nitride, diamond, aluminum nitride, and/or boron nitride. Alternatively, the epi layer may be formed on another epi layer 14, as described in greater detail below.

To form the first epi layer 14A on the underlying layer, the epi layer 14A may be grown using chemical vapor deposition (CVD). However, in some embodiments, the epi layer 14A may be grown onto the underlying layer using any suitable technique. The epi layer 14A may be formed from one or more wide-bandgap semiconductor materials, such as silicon carbide, gallium nitride, diamond, aluminum nitride, and/or boron nitride. Further, as discussed above, the epi layer 14A may have a first conductivity type (e.g., n-type) and a low dopant concentration relative to other regions of the SiC device 4 (e.g., the JTE 12, and/or the like). More specifically, for a SiC device 4A having a single JTE 12 (e.g., the device layer JTE 12Z), the first epi layer 14A may be formed with a minimized epi doping concentration that is less than or equal to $2.0 \times 10^{15}$ cm$^{-3}$, such as between $8.0 \times 10^{13}$ cm$^{-3}$ and $1.6 \times 10^{15}$ cm$^{-3}$. In embodiments having two or more JTEs 12 as illustrated in FIG. 2, the first epi layer 14A may be formed with a minimized epi doping concentration that is less than or equal to $5.0 \times 10^{15}$ cm$^{-3}$.

After the first epi layer 14A is formed on the underlying layer, the illustrated process 160 proceeds with implanting (block 163) the active area 6 of the epi layer 14A formed in block 162. As mentioned, in certain embodiments, the implantation operation of block 163 may be a HE implantation operation, and may extend though an entire thickness of the epi layer 14A. As mentioned, a suitable HE mask may be used to block implantation of the termination area 10 of the epi layer 14A. Additionally, as mentioned, the resulting active area 6 of the epi layer 14A has a doping concentration that is substantially greater than (e.g., 1.5×, 2×, 5×, 10×) the minimized epi doping concentration in the termination area 10 of the epi layer 14A.

After implanting the active area 6 with the desired concentration of the first conductivity type, the process 160 proceeds with an optional step of implanting (block 164) floating regions having the second conductivity type into the termination region 24A of the of the first epi layer 14A to define a junction termination 12, such as a JTE. More specifically, to manufacture a SiC device 4B with at least a first JTE 12A internal to the SiC device 4B (e.g., disposed in at least the epi layer 14A) and a device layer JTE 12Z adjacent to the surface 42 of the SiC device 4B, as illustrated in FIG. 26, the floating regions 68 may be implanted into the termination region 24A of the first epi layer 14A. As further described above, in SiC devices having additional epi layers 14, the floating regions 68 may be selectively implanted into the termination region of each epi layer 14, every other epi layer 14, and/or the like.

The floating regions 68 may be implanted according to any suitable means (e.g., high energy implant, lower energy implant). Accordingly, in some embodiments, the floating regions 68 may then be selectively implanted through a portion of the termination region 24A exposed by a mask formed on the termination region 24A, and the mask may then be removed. Further, the floating regions 68 may be implanted to a depth less than or equal to 1 µm. Accordingly, an implantation energy less than 500 keV may be used to implant each of the floating regions 68. However, in some embodiments, the floating regions 68 may be implanted according to a suitable high energy ion implantation technique. Accordingly, for such embodiments, each of the floating regions 68 may be implanted to a depth greater than approximately 5 µm and/or less than approximately 15 µm within the epi layer 14A. Moreover, an implantation energy greater than 500 keV and/or less than 50 MeV may generally be used to implant each of the floating regions 68.

In embodiments having only a device layer JTE 12Z, as illustrated in FIG. 1, the process 160 may proceed without the floating regions 68 being implanted into the termination region 24A of the first (buried) epi layer 14A. Nevertheless, to form a suitable number of epi layers 14 in the device, a portion of the process 160 (e.g., block 162 and/or block 164) may be repeated one or more times. Accordingly, after the floating regions 68 are implanted and/or in embodiments having only a device layer JTE 12Z, the process 160 may proceed with determining (decision block 166) whether an additional (buried) epi layer 14 will be added to the device structure, as indicated by the arrow 168. For example, in embodiments having one or more additional epi layers 14, a second epi layer (e.g., epi layer 14B, not shown) may be formed on the previously implanted epi layer 14A (block 162) and the active area of the second buried epi layer may be implanted with the desired doping concentration of the first conductivity type (block 163). Further, as described above, additional floating regions 68 may optionally be implanted (block 164) to define an additional buried JTE 12.

After completing fabrication of the one or more buried epi layers, the illustrated process 160 proceeds with forming (block 170) a top epi layer 14Z having a minimized epi doping concentration of a first conductivity type. As discussed with reference to the formation of the one or more buried epi layers 14 in blocks 162 and 164, the top epi layer 14Z may be grown using a deposition process (e.g., CVD). The top epi layer 14Z may also be formed from one or more wide-bandgap semiconductor materials, such as silicon carbide, gallium nitride, diamond, aluminum nitride, and/or boron nitride.

Further, the top epi layer 14Z may have a minimized epi doping concentration of the first conductivity type (e.g., n-type). More specifically, for a SiC device 4A having a single junction termination (e.g., JTE 12Z), the top epi layer 14Z may be formed with a minimized epi doping concentration that is less than or equal to $2.0 \times 10^{15}$ cm$^{-3}$, such as between $8.0 \times 10^{13}$ cm$^{-3}$ and $1.6 \times 10^{15}$ cm$^{-3}$. In embodiments, such as the SiC device 4B, having two or more junction termination features in different epi layers (e.g., JTE 12A, 12Z), the top epi layer 14Z may be formed with a minimized epi doping concentration that is less than or equal to $5.0 \times 10^{15}$ cm$^{-3}$. Further, in some embodiments, one or more regions having the first conductivity type may be implanted into a first portion of the device epi layer 14Z (e.g., the active region 32Z and the intermediate region 28Z) to adjust the doping concentration of the first conductivity type in other portions of the device epi layer 14Z to a doping concentration greater than or equal to $5 \times 10^{15}$ per cubic centimeter (cm$^{-3}$), such as $1.0 \times 10^{16}$ cm$^{-3}$.

For the embodiment illustrated in FIG. 25, after the top epi layer 14Z is formed on the underlying layer, the process 160 proceeds with implanting (block 171) the active area 6 of the top epi layer formed in block 170. As mentioned, in certain embodiments, the implantation operation of block 171 may be a HE implantation operation, and may extend though an entire thickness of the epi layer 14Z. As mentioned, a suitable HE mask may be used to block implantation of the termination area 10 of the epi layer 14Z during the implantation process. Additionally, as mentioned, the resulting active area 6 of the top epi layer 14Z has a doping concentration that is substantially greater than (e.g., 1.5×, 2×, 5×, 10×) the minimized epi doping concentration in the termination area 10 of the epi layer.

For the embodiment illustrated in FIG. 25, the process 160 proceeds with forming (block 172) device features within the active region 32Z and/or the intermediate region 28Z of the top epi layer 14Z to define the device layer 16 of the SiC device 4. That is, for example, the well region 40, the source region 44, and/or the like may be formed (e.g., implanted) in the active region 32Z and/or the intermediate region 28Z to define the device layer 16. While block 172 is described herein as a single step, it may be appreciated that forming the device features (e.g., the well region 40, the intermediate well region 66, the source region 44, and/or the like) may constitute multiple steps, such as a separate implantation step for each respective feature and/or each conductivity type. Accordingly, embodiments described herein are intended to be illustrative and not limiting.

For the embodiment illustrated in FIG. 25, the process 160 proceeds with implanting (block 174) floating regions having the second conductivity type into the termination region 24Z of the device epi layer 14Z to define a junction termination, such as the JTE 12Z of the device layer 16. As described above with reference to block 164, the floating regions 68 may be implanted according to any suitable means (e.g., high energy implant, lower energy implant) to a certain depth within the termination region 24Z (e.g., greater than approximately 5 μm and/or less than approximately 15 μm or less than or equal to 1 μm, respectively). Further, in some embodiments, the floating regions 68 implanted into the termination region 24Z may have the same effective doping profile as the floating regions 68 implanted into termination regions 24 (e.g., 24A, 24B, and/or the like) formed at previous steps (e.g., process block 206) of the process 200. In other embodiments, however, the floating regions 68 implanted into the termination region 24Z may have a different effective doping profile compared to the floating regions 68 implanted into other termination regions 24 (e.g., 24A, 24B, and/or the like). For example, the JTE 12Z defined by the floating regions 68 implanted into the device termination region 24Z may have an integrated charge of $1.6 \times 10^{13}$ cm$^{-2}$, while the JTE 12A defined by the floating regions 68 implanted into the termination region 24A may have an integrated charge of $9.0 \times 10^{12}$ cm$^{-2}$, as discussed above. Subsequently, other processing steps may be performed to form other features (e.g., gate electrode 48, dielectric layer 46, source contact 54, drain contact 50, and/or the like) of the SiC device 4 to form a functional device, in accordance with the present disclosure.

Technical effects of the present approach include effective termination of wide band gap devices, including SiC devices. Additionally, the disclosed termination designs consume a relatively smaller portion of the die area relative to typical termination designs and are relatively low-cost to fabricate. For example, the disclosed junction termination designs (e.g., JTE designs) may have a width such that the ratio of the junction width to the one dimensional (1D) depletion width is minimized (e.g., less than 5, such as between 1.5 and 5, between 1.5 and 4, between 1.5 and 3, between 1.5 and 2.5), which results in a device having increased die area available for the active area. Additionally, the disclosed termination designs cause avalanche breakdown to desirably occur predominately within the active area and/or intermediate area of the device, enabling a breakdown voltage that is close to device entitlement.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A semiconductor device, comprising:
   a first epitaxial (epi) layer disposed on a substrate layer, wherein a termination area of the first epi layer comprises a minimized epi doping concentration of a first conductivity type; and
   a second epi layer disposed on the first epi layer, wherein a termination area of the second epi layer comprises the minimized epi doping concentration of the first conductivity type and a first plurality of floating regions of a second conductivity type that form a first junction termination of the semiconductor device, wherein the first junction termination has a width that is less than five times a 1D depletion width of the semiconductor device and is configured to achieve at least 90% of a block voltage entitlement of the semiconductor device, and wherein the 1D depletion width is a combined thickness of all epi layers of the semiconductor device;
   wherein an active area of the first epi layer and an active area of the second epi layer comprise a particular doping concentration of the first conductivity type, and wherein the particular doping concentration is more than one and a half times (1.5×) greater than the minimized epi doping concentration.

2. The semiconductor device of claim 1, wherein the particular doping concentration is more than two times (2×) greater than the minimized epi doping concentration.

3. The semiconductor device of claim 2, wherein the particular doping concentration is more than ten times (10×) greater than the minimized epi doping concentration.

4. The semiconductor device of claim 2, wherein the semiconductor device is a silicon carbide (SiC) device, and wherein the particular doping concentration is greater than or equal to $3 \times 10^{15}$ cm$^{-3}$.

5. The semiconductor device of claim 2, wherein the minimized epi doping concentration is less than or equal to approximately $2 \times 10^{15}$ cm$^{-3}$ and greater than or equal to approximately $4 \times 10^{14}$ cm$^{-3}$.

6. The semiconductor device of claim 1, wherein the first junction termination comprises a floating field ring (FFR), a single zone junction termination extension (JTE), a multiple zone JTE, a graded zone JTE, a multiple floating zone JTE, a space modulated JTE, or a combination thereof.

7. The semiconductor device of claim 1, wherein the width of the first junction termination is less than three times the 1D depletion width of the semiconductor device.

8. The semiconductor device of claim 1, wherein the width of the first junction termination is approximately 2.5 times the 1D depletion width of the semiconductor device.

9. The semiconductor device of claim 8, wherein the first junction termination is configured to achieve 100% of the blocking voltage entitlement of the semiconductor device.

10. The semiconductor device of claim 1, wherein the termination area of the first epi layer comprises a second plurality of floating regions of the second conductivity type that form a second junction termination of the semiconductor device.

11. The semiconductor device of claim 10, wherein the second junction termination comprises a first integrated charge, wherein the first junction termination has a second integrated charge greater than the first integrated charge.

12. The semiconductor device of claim 1, wherein the semiconductor device comprises a metal-oxide-semiconductor field-effect transistor (MOSFET), a junction field effect transistor (JFET), a bipolar junction transistor (BJTs), or a diode.

13. The semiconductor device of claim 1, wherein the semiconductor device consists of the first epi layer and the second epi layer, and wherein the 1D depletion width is the combined thickness of the first epi layer and the second epi layer.

14. The semiconductor device of claim 1, wherein the semiconductor device comprises a third epi layer disposed on the second epi layer, and wherein the 1D depletion width is the combined thickness of the first epi layer, the second epi layer, and the third epi layer.

15. A semiconductor device, comprising:
a first epitaxial (epi) layer disposed on a substrate layer, wherein a termination area of the first epi layer comprises a minimized epi doping concentration of a first conductivity type and a first plurality of floating regions of a second conductivity type that form a first junction termination of the semiconductor device; and
a second epi layer disposed on the first epi layer, wherein a termination area of the second epi layer comprises the minimized epi doping concentration of the first conductivity type and a second plurality of floating regions of the second conductivity type that form a second junction termination of the semiconductor device, wherein the second junction termination comprises a first integrated charge, and wherein the first junction termination has a second integrated charge greater than the first integrated charge.

16. The semiconductor device of claim 15, wherein the first junction termination comprises a junction termination extension (JTE), and wherein the JTE comprises a width that is between two times (2×) and three times (3×) a combined thickness of the first and second epi layers.

17. The semiconductor device of claim 15, wherein the first junction termination is configured to achieve at least 90% of a blocking voltage entitlement of the semiconductor device.

18. The semiconductor device of claim 15, wherein the minimized epi doping concentration is less than or equal to $1 \times 10^{15}$ cm$^{-3}$.

19. A semiconductor device, comprising:
a first epitaxial (epi) layer disposed on a substrate layer, wherein a termination area of the first epi layer comprises a minimized epi doping concentration of a first conductivity type, and wherein the minimized epi doping concentration is less than or equal to approximately $2 \times 10^{15}$ cm$^{-3}$ and greater than or equal to approximately $4 \times 10^{14}$ cm$^{-3}$; and
a second epi layer disposed on the first epi layer, wherein a termination area of the second epi layer comprises the minimized epi doping concentration of the first conductivity type and a first plurality of floating regions of a second conductivity type that form a first junction termination of the semiconductor device, wherein the first junction termination has a width that is less than five times a 1D depletion width of the semiconductor device and is configured to achieve at least 90% of a block voltage entitlement of the semiconductor device, and wherein the 1D depletion width is a combined thickness of all epi layers of the semiconductor device.

20. The semiconductor device of claim 19, wherein an active area of the first epi layer and an active area of the second epi layer comprises a particular doping concentration of the first conductivity type, and wherein the particular doping concentration is more than one and a half times (1.5×) greater than the minimized epi doping concentration.

* * * * *